(12) United States Patent
Toishi et al.

(10) Patent No.: US 7,132,218 B2
(45) Date of Patent: Nov. 7, 2006

(54) CHEMICALLY AMPLIFIED POSITIVE RESIST COMPOSITION

(75) Inventors: Kouji Toishi, Toyonaka (JP); Yoshiyuki Takata, Toyonaka (JP); Satoshi Yamaguchi, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/082,835

(22) Filed: Mar. 18, 2005

(65) Prior Publication Data

US 2005/0214676 A1  Sep. 29, 2005

(30) Foreign Application Priority Data

Mar. 23, 2004  (JP) .............................. 2004-084234

(51) Int. Cl.
*G03F 7/004* (2006.01)
(52) U.S. Cl. .................... 430/270.1; 430/905; 430/910
(58) Field of Classification Search ............. 430/270.1, 430/905, 910
See application file for complete search history.

(56) References Cited

U.S. PATENT DOCUMENTS

| | | | |
|---|---|---|---|
| 5,158,855 A | 10/1992 | Sugiyama et al. | |
| 5,879,857 A | 3/1999 | Chandross et al. | |
| 5,998,099 A | 12/1999 | Houlihan et al. | |
| 2003/0031950 A1 | 2/2003 | Uenishi et al. | |
| 2004/0126697 A1* | 7/2004 | Farnham et al. | 430/270.1 |
| 2004/0146802 A1* | 7/2004 | Yamamoto et al. | 430/270.1 |
| 2004/0161697 A2* | 8/2004 | Kodama et al. | 430/270.1 |

* cited by examiner

*Primary Examiner*—John S. Chu
(74) *Attorney, Agent, or Firm*—Birch, Stewart, Kolasch & Birch, LLP

(57) ABSTRACT

The present invention provide a chemically amplified positive resist composition comprising
a resin which contains a structural unit having an acid labile group and which itself is insoluble or poorly soluble in an alkali aqueous solution and becomes soluble in an alkali aqueous solution by the action of an acid;
an acid generator; and
a compound of the formula (C-1)

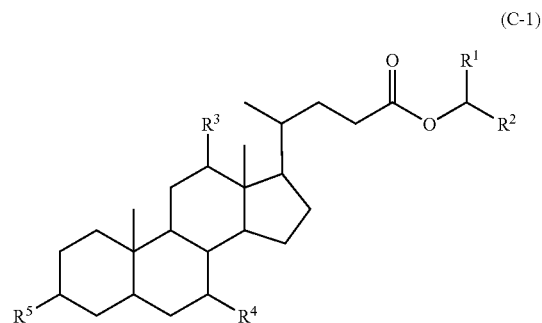

(C-1)

wherein $R^1$ and $R^2$ each independently represents a hydrogen or an alkyl having 1 to 4 carbon atoms, $R^3$, $R^4$ and $R^5$ each independently represents a hydrogen or a hydroxyl.

10 Claims, No Drawings

CHEMICALLY AMPLIFIED POSITIVE RESIST COMPOSITION

This nonprovisional application claims priority under 35 U.S.C. § 119(a) on patent application Ser. No. 2004-084234 filed in JAPAN on Mar. 23, 2004, the entire contents of which are hereby incorporated by reference.

BACKGROUND OF THE INVENTION

1. Field of the Invention

The present invention relates to a chemically amplified positive resist composition for use in microfabrication of semiconductor.

2. Prior Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm, KrF excimer laser having a wavelength of 248 nm and ArF excimer laser having a wavelength of 193 nm. $F_2$ excimer laser having a wavelength of 157 nm seems to be the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser. In the meantime, as the lithography technology of the next generation, immersion lithography using ArF excimer laser having a wavelength of 193 nm or F2 excimer laser having a wavelength of 157 nm is proposed.

Since light sources having shorter wavelength than that of g line and i line, such as excimer laser and the like have low illumination, it is necessary to enhance the sensitivity of a resist. Consequently, there are used so-called chemically amplified resists utilizing the catalytic action of an acid produced from a sulfonium salt and the like by exposure and containing a resin having a group being dissociated by this acid, as seen, for example, in JP-A-2000-137327.

However, contact hole pattern obtained by such known chemically amplified resist compositions are not satisfactory, though they provide good line and space patterns.

SUMMARY OF THE INVENTION

An object of the present invention is to provide a chemically amplified positive resist composition which is capable of resolving fine contact hole pattern with less deterioration of sensitivity as well as being excellent in various resist properties such as accuracy of roundness, pattern shape, and the like.

The present invention relates to the followings:

<1> A chemically amplified positive resist composition comprising a resin which contains a structural unit having an acid labile group and which itself is insoluble or poorly soluble in an alkali aqueous solution and becomes soluble in an alkali aqueous solution by the action of an acid;

an acid generator; and a compound of the formula (C-1)

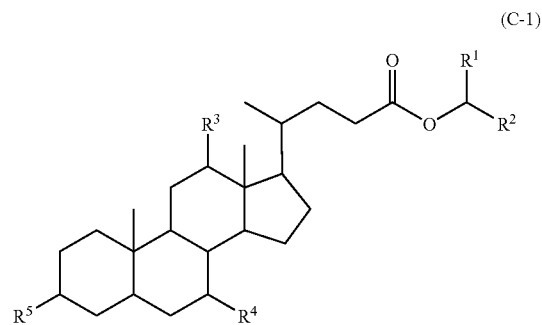

wherein $R^1$ and $R^2$ each independently represents a hydrogen or an alkyl having 1 to 4 carbon atoms, $R^3$, $R^4$ and $R^5$ each independently represents a hydrogen or a hydroxyl.

<2> The composition according to <1>, wherein the content of the resin, the content of the acid generator and the content of the compound of the formula (C-1) are 80 to 98.5% by weight, 1 to 5% by weight and 0.5 to 10% by weight respectively, based on the total solid content of the composition.

<3> The composition according to <1> or <2>, wherein the content of the structural unit having an acid labile group is 10 to 50% by mol in the total structural units of the resin.

<4> The composition according to any of <1> to <3>, wherein the structural unit having an acid-labile group is a structural unit derived from 2-alkyl-2-adamantyl (meth)acrylate optionally substituted or 1-(1-adamantyl)-1-alkylalkyl (meth)acrylate optionally substituted.

<5> The composition according to <4>, wherein the resin further contains at least one structural unit selected from the group consisting of a structural unit derived from optionally substituted 1-alkylcyclohexyl (meth)acrylate or a structural unit derived from optionally substituted 1-alkylcyclopentyl (meth)acrylate.

<6> The composition according to any of <1> to <5>, wherein the resin further contains, in addition to the structural unit having the acid-labile group, at least one structural unit selected from the group consisting of a structural unit derived from optionally substituted 3-hydroxy-1-adamantyl (meth)acrylate, a structural unit derived from optionally substituted 3,5-dihydroxy-1-adamantyl (meth)acrylate, a structural unit derived from (meth)acryoyloxy-γ-butyrolactone having a lactone ring optionally substituted by alkyl and a structural unit of the following formula (IV)

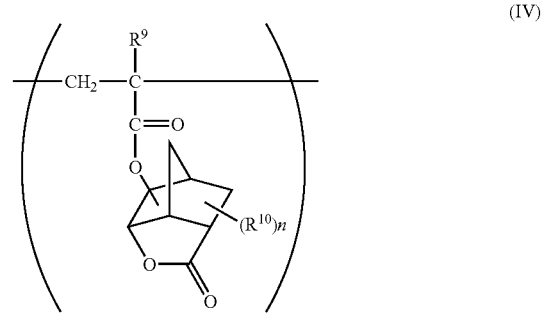

wherein $R^9$, represents a hydrogen or a methyl, $R^{10}$ represents a methyl, and a represents an integer of 0 to 3.

<7> The composition according to any of <1> to <6>, wherein the acid generator is a compound of the formula (VIIa):

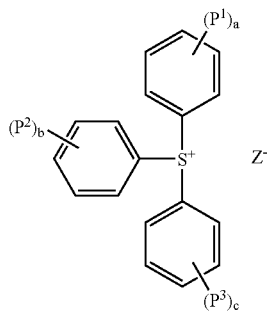

(VIIa)

wherein $P^1$, $P^2$, and $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^1$ is the same or different, when b is 2 or more, each of $P^2$ is the same or different, when c is 2 or more, each of $P^3$ is the same or different, and $Z^-$ represents a counter anion, a compound of the formula (VIIb):

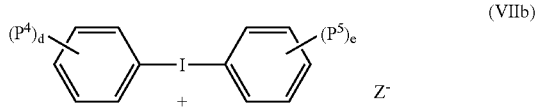

(VIIb)

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above, or a compound of the formula (VIIc):

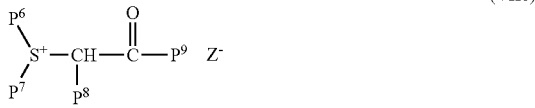

(VIIc)

wherein $P^6$ and $P^7$ each independently represents an alkyl having 1 to 6 carbon atoms or a cycloalkyl having 3 to 10 carbon atoms, or $P^6$ and $P^7$ bond to form a divalent acyclic hydrocarbon having 3 to 7 carbon atoms which forms a ring together with the adjacent $S^+$, and at least one $CH_2$ in the divalent acyclic hydrocarbon may be substituted by —CO—, —O— or —S—, $P^8$ represents a hydrogen, $P^9$ represents an alkyl having 1 to 6 carbon atoms, a cycloalkyl having 3 to 10 carbon atoms or an aromatic ring group optionally substituted, or $P^8$ and $P^9$ bond to form 2-oxocycloalkyl together with the adjacent —CHCO—, and $Z^-$ has the same meaning as defined above.

<8> The composition according to <7>, wherein $Z^-$ is an anion of the formula (VIII)

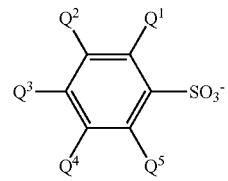

(VIII)

wherein $Q^1$, $Q^2$, $Q^3$, $Q^4$ and $Q^5$ each independently represents a hydrogen, an alkyl having 1 to 16 carbon atoms, an alkoxy having 1 to 16 carbon atoms, a halogen, a formyl, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

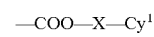

—COO—X—$Cy^1$       (VIII')

wherein X represents an alkylene and at least one —$CH_2$— in the alkylene may be substituted by —O— or —S—, $Cy^1$ represents an alicyclic hydrocarbon having 3 to 20 carbon atoms.

<9> The composition according to any of <1> to <8>, which further comprises organic basic compound.

<10> The composition according to <9>, wherein the organic basic compound is a compound of the formula (XII)

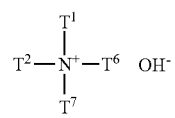

(XII)

wherein $T^1$, $T^2$ and $T^7$ each independently represents an alkyl, a cycloalkyl or an aryl, wherein at least one hydrogen on the alkyl, cycloalkyl or aryl may each independently be substituted with hydroxyl, amino, or alkoxy having 1 to 6 carbon atoms, wherein at least one hydrogen on the amino each independently may be substituted with alkyl having 1 to 4 carbon atoms, and $T^6$ represents an alkyl or a cycloalkyl, wherein at least one hydrogen on the alkyl or cycloalkyl may each independently be substituted with hydroxyl, amino, or alkoxy having 1 to 6 carbon atoms, wherein at least one hydrogen on the amino may be substituted with alkyl having 1 to 4 carbon atoms.

DESCRIPTION OF PREFERRED EMBODIMENTS

The present composition comprises a resin which contains a structural unit having an acid labile group and which itself is insoluble or poorly soluble in an alkali aqueous solution but becomes soluble in an alkali aqueous solution by the action of an acid;

an acid generator; and a compound of the formula (C-1).

$R^1$ and $R^2$ in the formula (C-1) each independently represents a hydrogen or an alkyl having 1 to 4 carbon atoms. Examples of the alkyl include methyl, ethyl, propyl, isopro pyl, butyl isobutyl, sec-butyl and tert-butyl. $R^3$, $R^4$ and $R^5$ each independently represents hydrogen or hydroxyl. Hydrogen is preferred as $R^1$ and $R^2$, and hydroxyl is preferred at $R^3$, $R^4$ and $R^5$.

Specific examples of the compound of the formula (C-1) include the compounds of the following formulae:

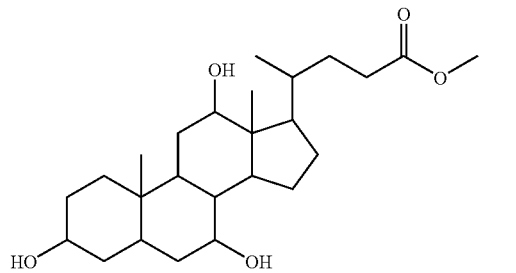

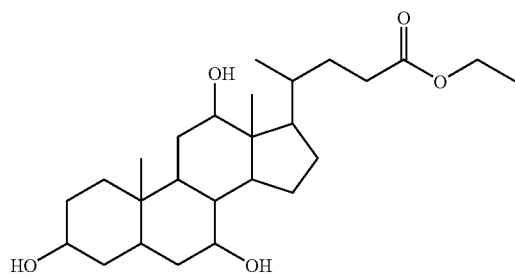

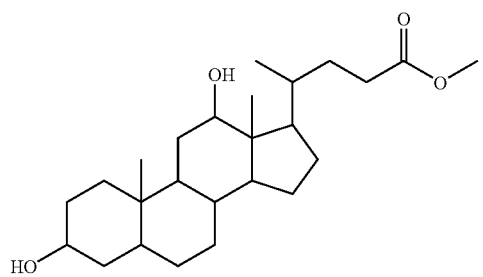

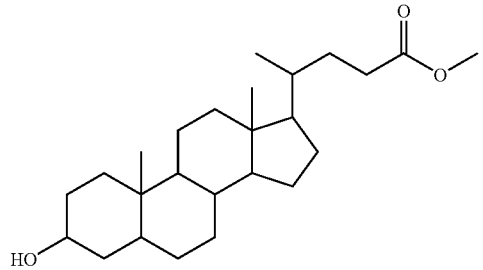

-continued

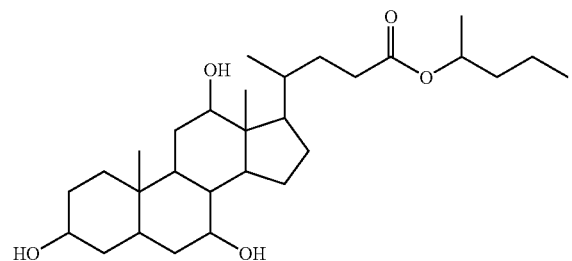

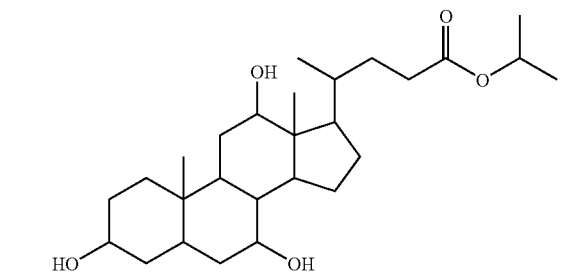

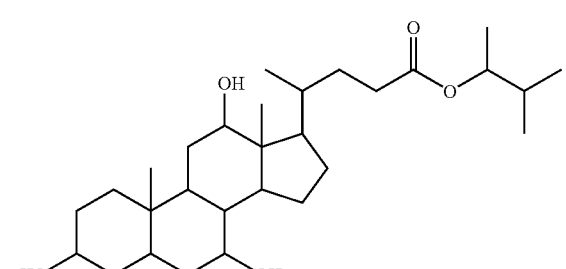

The compound of the formula (C-2)

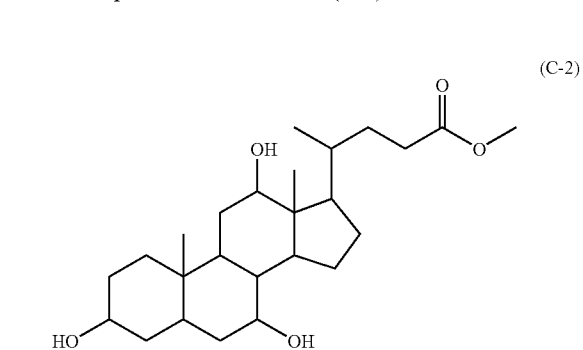

(C-2)

is preferred.

Next, resin components constituting the present composition will be explained. The resin used in the present composition contains a structural unit having an acid-labile group and the resin is insoluble or poorly soluble itself in alkali aqueous solution and becomes soluble in an alkali aqueous solution by the action of an acid. Specifically, the resin shows partial dissociation of groups by the action of an acid to become soluble in alkali aqueous solution after the dissociation. The acid-labile group can be selected from conventionally known various groups.

Specific examples of such group include tert-butyl; a group in which a quaternary carbon bonds to oxygen atom such as tert-butoxycarbonyl, tert-butoxycarbonylmethyl, and the like; an acetal type group such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl, 1-[2-(1-adamantanecarbonyloxy)ethoxy]ethyl, and the like; a residue of alicyclic compound such as 3-oxocyclohexyl, 4-methyltetrahydro-2-pyron-4-yl, which is introduced from mevalonic lactone, 2-alkyl-2-adamantyl optionally substituted, 1-(1-adamantyl)-1-alkylalkyl optionally substituted, 1-alkylcyclohexyl optionally substituted, 1-alkylcyclopentyl optionally substituted and the like.

Hydrogen of phenolic hydroxyl or of carboxyl in the resin is substituted with the acid-labile group. The acid-labile group can be introduced into alkali soluble resin having carboxyl or phenolic hydroxyl by any conventional substituent introduction reaction to obtain the resin used in the present composition. The resin used in the present composition can also be obtained by copolymerization of an unsaturated compound having the acid-labile group above as one of monomers.

Among the structural unit having an acid-labile group, those having a bulky group containing alicyclic group such as, for example, 2-alkyl-2-adamantyl optionally substituted and 1-(1-adamantyl) 1 alkylalkyl optionally substituted, as the group dissociated by the action of an acid, since excellent resolution is obtained when used in the present composition.

Examples of such structural unit containing a bulky group include a structural unit derived from 2-alkyl-2-adamantyl (meth)acrylate, a structural unit derived from 1-(1-adamantyl)-1-alkylalkyl (meth)acrylate, a structural unit derived from 2-alkyl-2-adamantyl 5-norbornene-2-carboxylate, a structural unit derived from 1-(1-adamantyl) 1-alkylalkyl 5-norbornene-2-carboxylate, and the like.

Particularly when the resin component in the present composition contains the structural unit derived from 2-alkyl-2-adamantyl (meth)acrylate or from 1-(1-adamantyl)-1-alkylalkyl (meth)acrylate, the resist composition gives excellent resolution.

Typical examples of such structural unit derived from 2-alkyl-2-adamantyl (meth)acrylate include structural units derived from 2-methyl-2-adamantyl acrylate, from 2-methyl-2-adamantyl methacrylate, from 2-ethyl-2-adamantyl acrylate, from 2-ethyl-2-adamantyl methacrylate, from 2-n-butyl-2-adamantyl acrylate, and the like. When particularly the resin component in the present composition contains the structural unit derived from 2-methyl-2-adamantyl (meth)acrylate, the resist composition gives excellent balance between sensitivity and heat resistance. In the present invention, two or more kind of structural units having group dissociated by the action of an acid may be contained, if necessary.

Specific examples of monomers for the structural unit derive from 2-alkyl-2-adamantyl (meth)acrylate optionally substituted include the monomers of the following formulae:

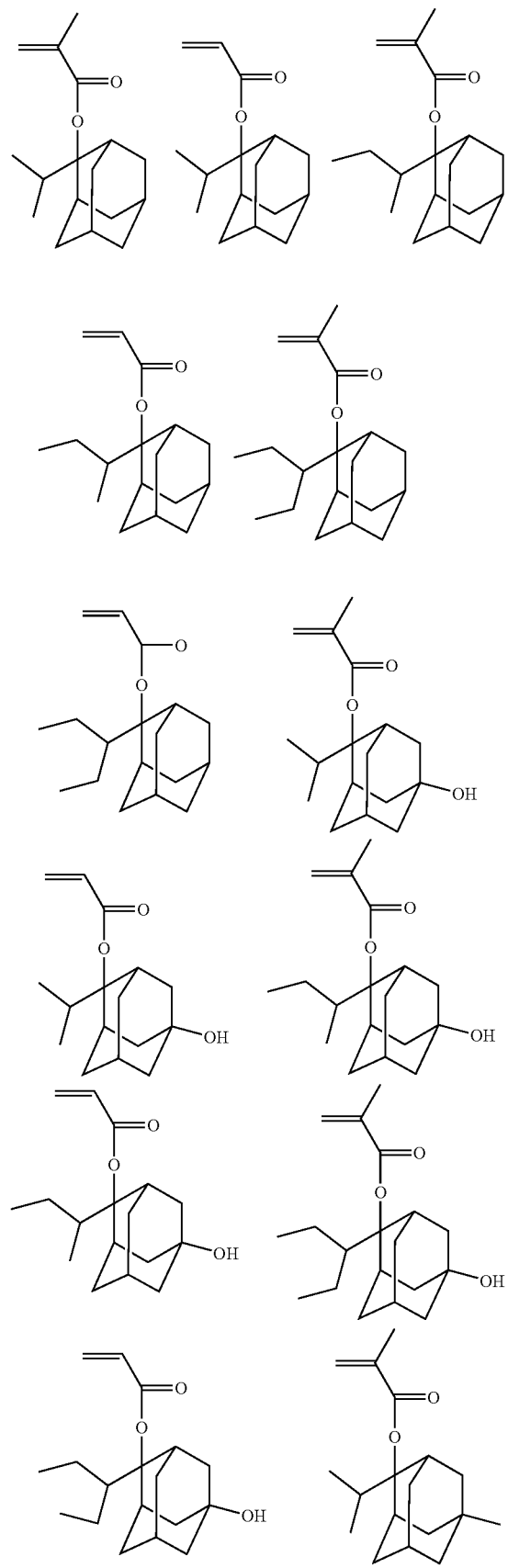

-continued
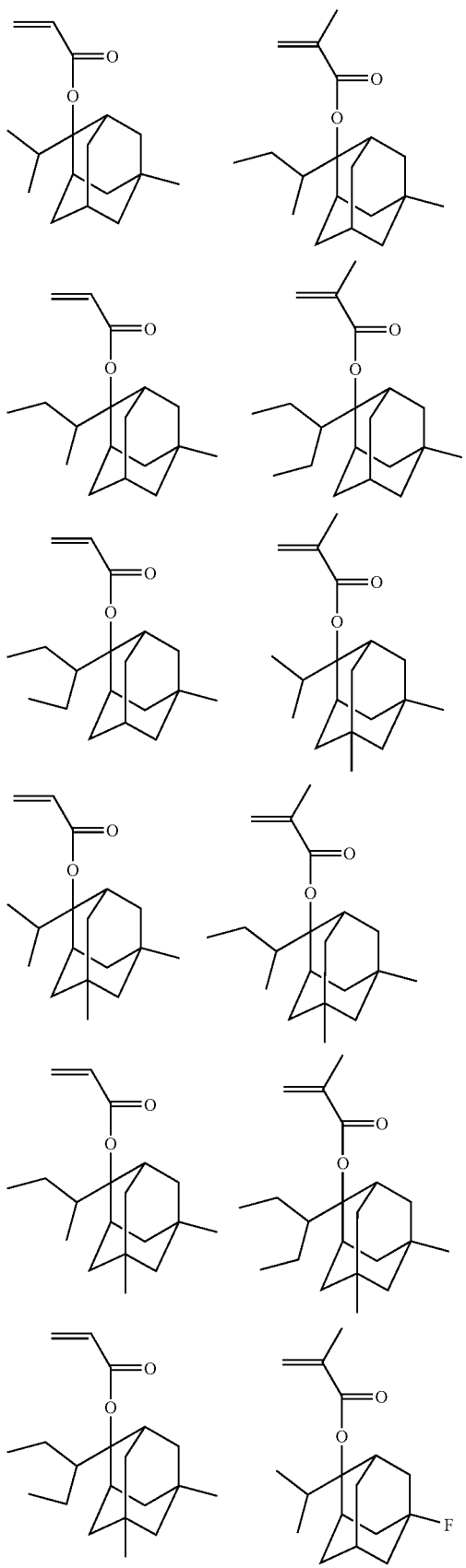
-continued
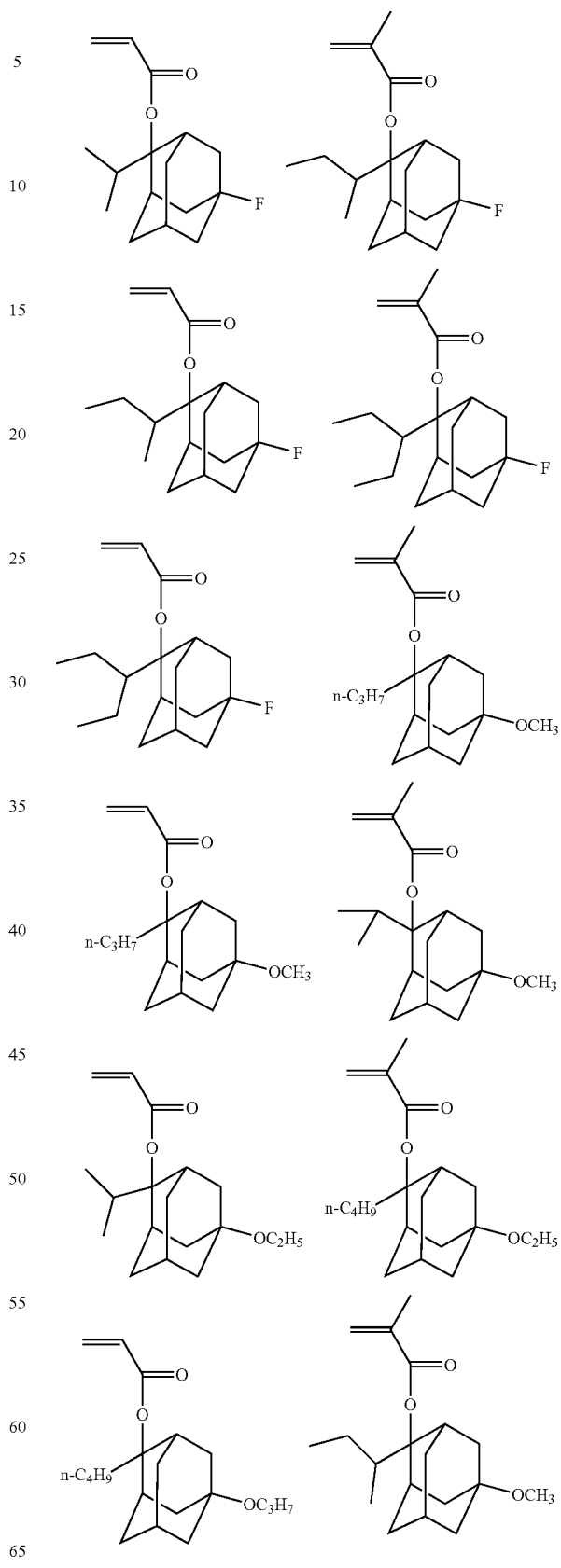

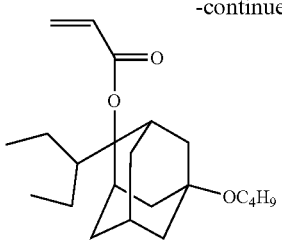

2-Alkyl-2-adamantyl (meth)acrylate can usually be produced by reacting 2-alkyl-2-adamantanol or metal salt thereof with an acrylic halide or methacrylic halide.

Specific examples of monomers for the structural unit derive from optionally substituted 1-(1-adamantyl)-1-alkylalkyl (meth)acrylate include the monomers of the following formulae:

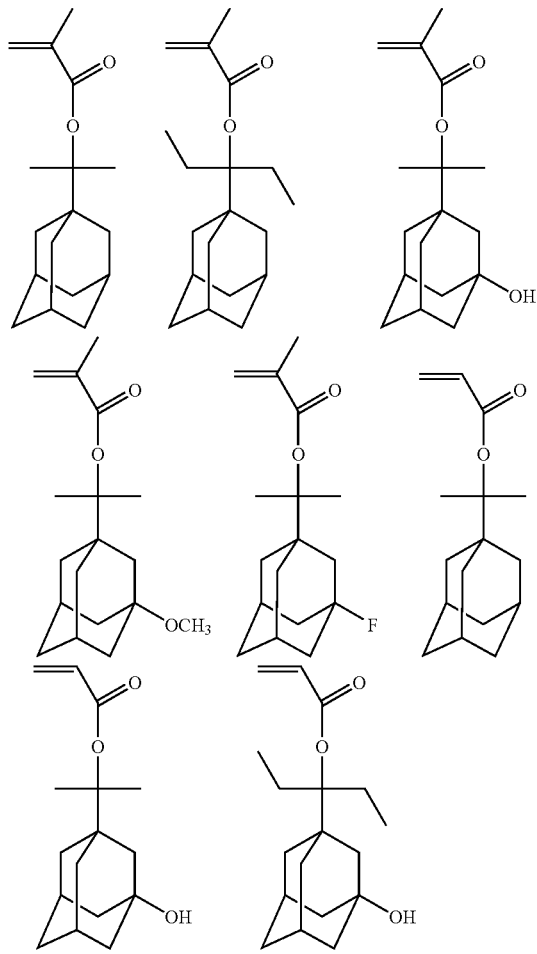

1-(1-Adamantyl)-1-alkylalkyl (meth)acrylate can usually be produced by reacting 1-(1-adamantyl)-1-alkylalkanol or metal salt thereof with an acrylic halide or methacrylic halide.

In the present composition, as the resist composition gives excellent line edge roughness, it is preferred that the resin component further contains a structural unit derived from optionally substituted 1-alkyl-1-cyclohexyl (meth)acrylate or from optionally substituted 1-alkyl-1-cyclopentyl (meth) acrylate, in addition to the structural unit derived from optionally substituted 2-alkyl-2-adamantyl (meth)acrylate or from optionally substituted 1-(1-adamantyl)-1-alkylalkyl methacrylate.

Typical examples of such structural unit derived from 1-alkyl-1-cyclohexyl (meth)acrylate include structural units derived from 1-methylcyclohexyl acrylate, from 1-methylcyclohexyl methacrylate, from 1-ethylcyclohexyl acrylate, from 1-ethylcyclohexyl methacrylate, from 1-n-butylcyclohexyl acrylate, from 1-n-butylcyclohexyl methacrylate, and the like. When particularly the resin component in the present composition contains the structural unit derived from 1-methylcyclohexyl (meth)acrylate, the resist composition gives excellent balance between sensitivity and heat resistance.

Specific examples of monomers for the structural unit derive from optionally substituted 1-alkylcyclohexyl (meth) acrylate include the monomers of the following formulae:

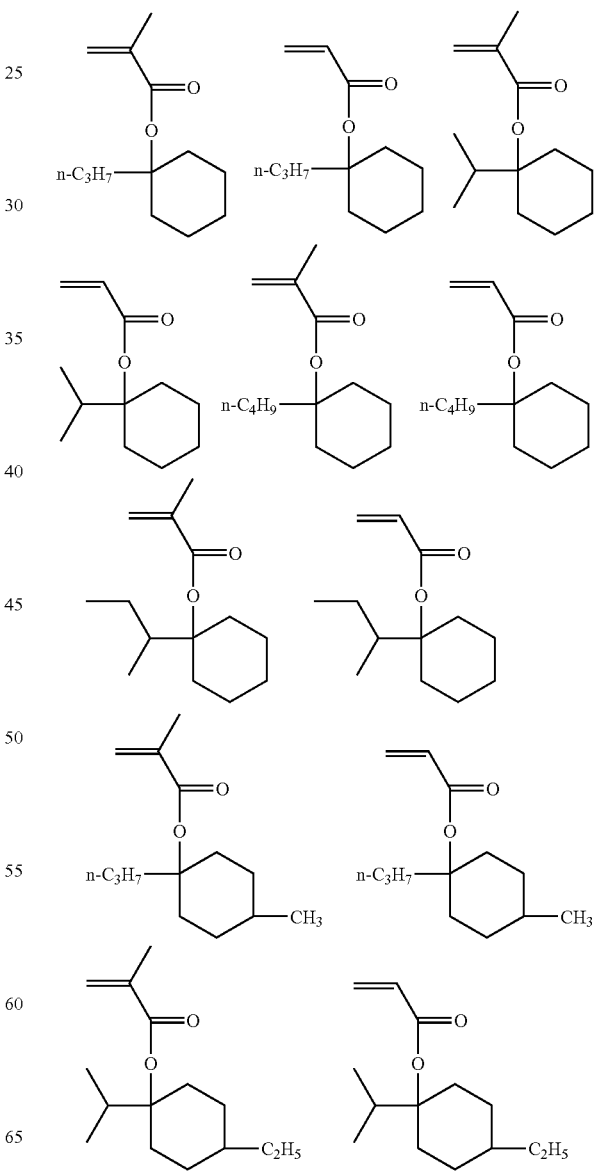

-continued

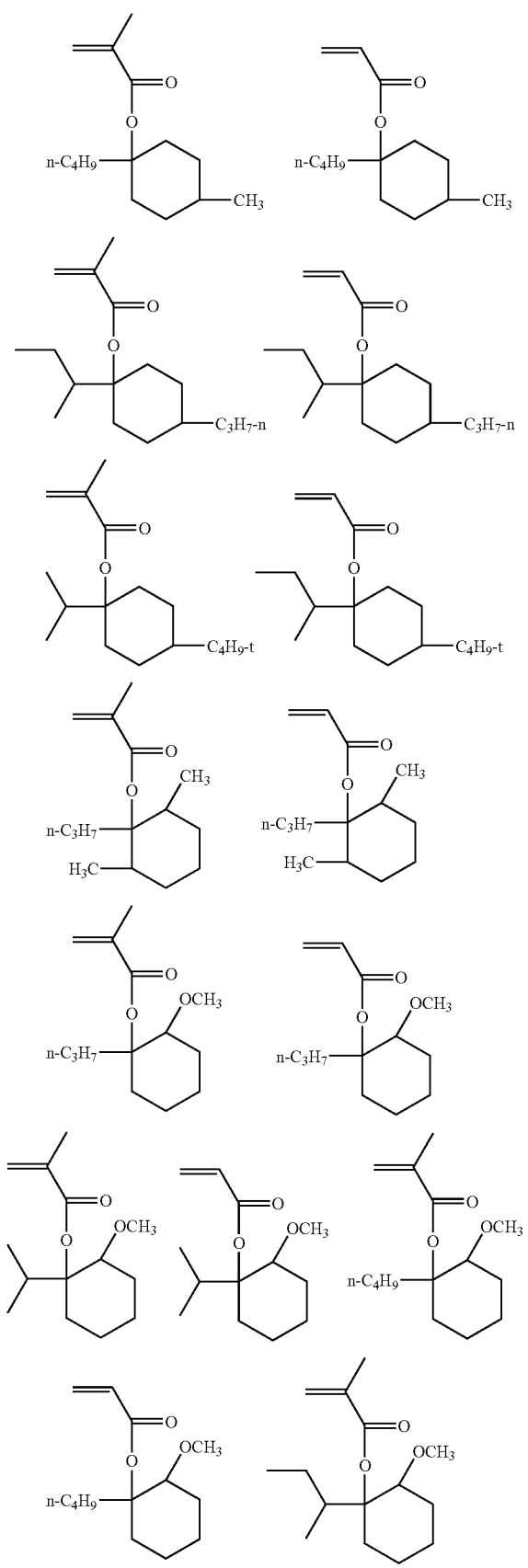
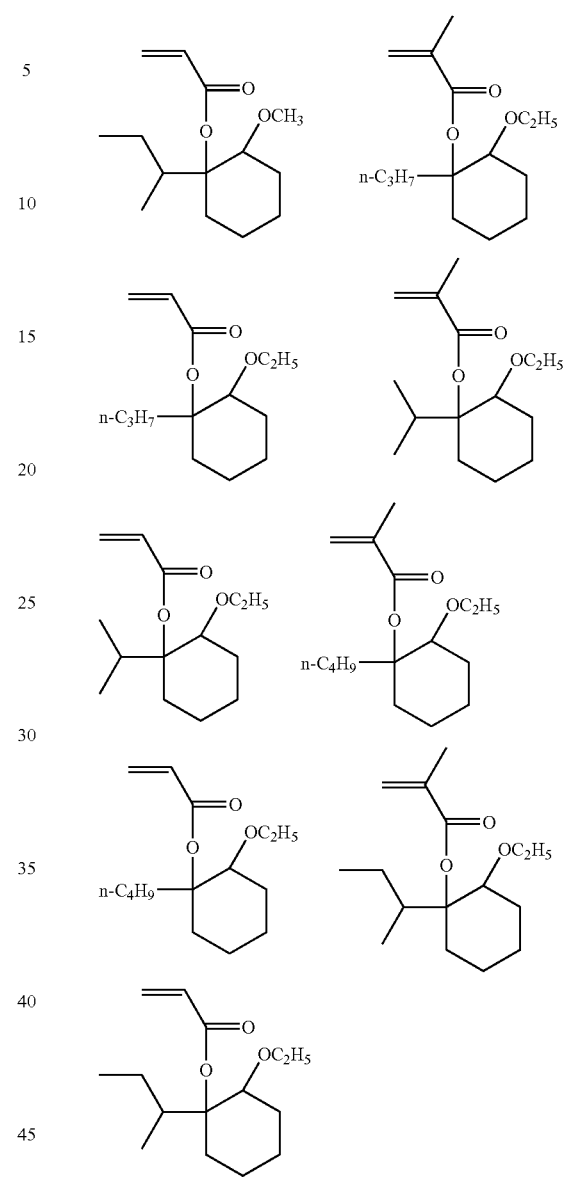

1-Aalkylcyclohexyl (meth)acrylate can usually be produced by reacting 1-alkylcyclohexanol or metal salt thereof with an acrylic halide or methacrylic halide.

Typical examples of such structural unit derived from 1-alkyl-1-cyclopentyl (meth)acrylate include structural units derived from 1-methylcyclopentyl acrylate, from 1-methylcyclopentyl methacrylate, from 1-ethylcyclopentyl acrylate, from 1-ethylcyclopentyl methacrylate, from 1-n-butylcyclopentyl acrylate, from 1-n-butylcyclopentyl methacrylate, and the like. When particularly the resin component in the present composition contains the structural unit derived from 1-methylcyclopentyl (meth)acrylate, the resist composition gives excellent balance between sensitivity and heat resistance.

Specific examples of monomers for the structural unit derive from optionally substituted 1-alkylcyclopentyl (meth) acrylate include the monomers of the following formulae:

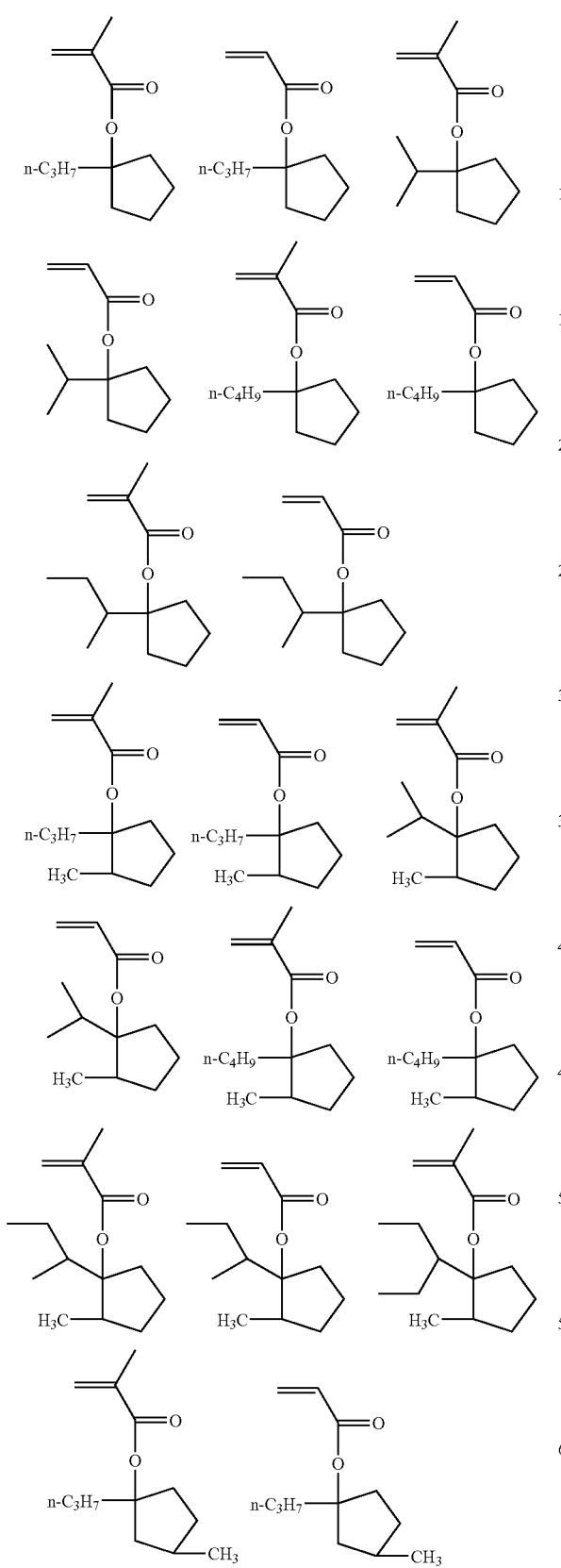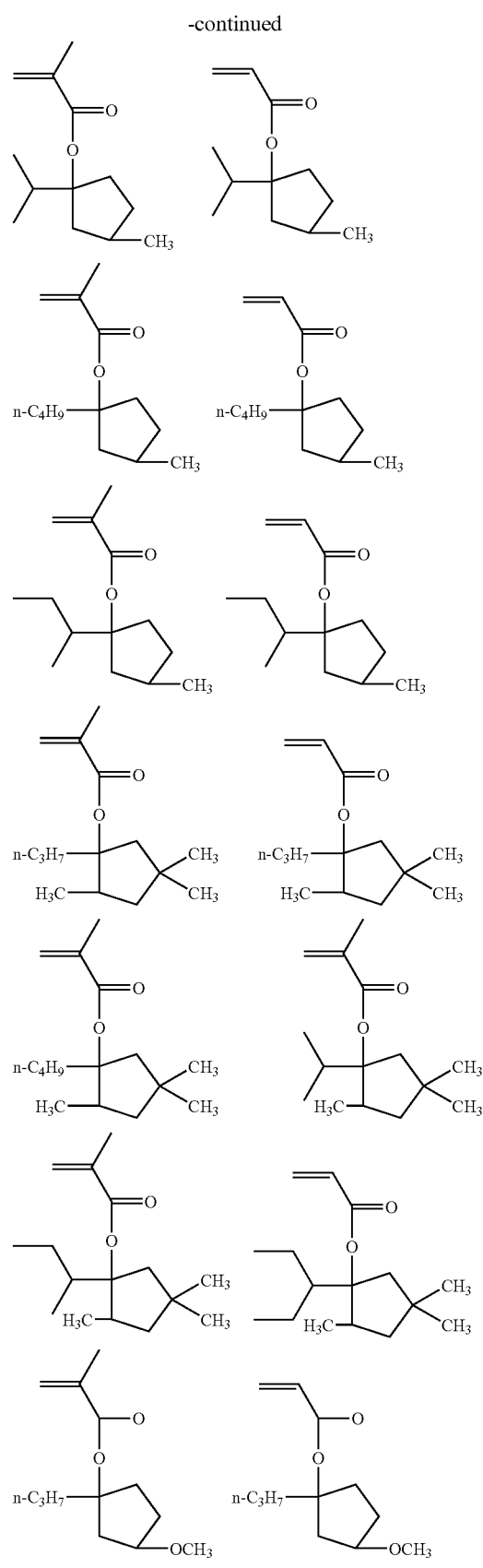

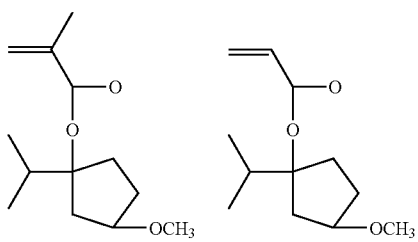

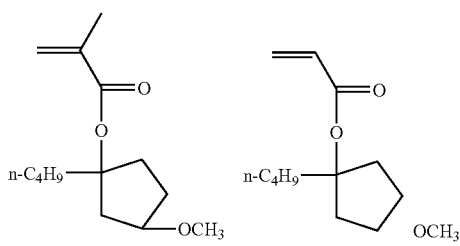

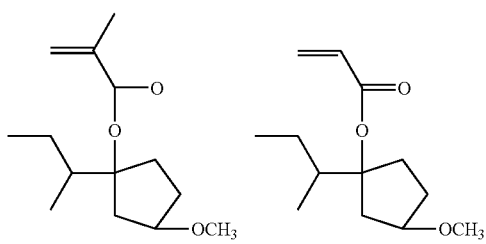

1-Aalkylcyclopentyl (meth)acrylate can usually be produced by reacting 1-alkylcyclopentanol or metal salt thereof with an acrylic halide or methacrylic halide.

The resin used for the present composition can also contain, in addition to the above-mentioned structural units having an acid-labile group, other structural units not dissociated or not easily dissociated by the action of an acid. Examples of such other structural units which can be contained include structural units derived from monomers having a free carboxyl group such as acrylic acid and methacrylic acid, structural unit derived from (meth)acrylonitrile, structural unit derived from other (meth)acrylates than above, and the like.

In the case of KrF exposure, there is no problem on light absorption, and a structural unit derived from hydroxystyrene can be further contained.

Particularly, to contain, in addition to the structural unit having an acid-labile group, further at least one structural unit selected from the group consisting of a structural unit derived from 3-hydroxy-1-adamantyl (meth)acrylate optionally substituted by alkyl or alkoxy, a structural unit derived from 3,5-dihydroxy-1-adamantyl (meth)acrylate optionally substituted by alkyl or alkoxy, a structural unit derived from (meth)acryloyloxy-γ-butyrolactone optionally substituted by alkyl and a structural unit of the following formula (IV), in the resin in the present composition, is preferable from the standpoint of the adhesiveness of resist to a substrate.

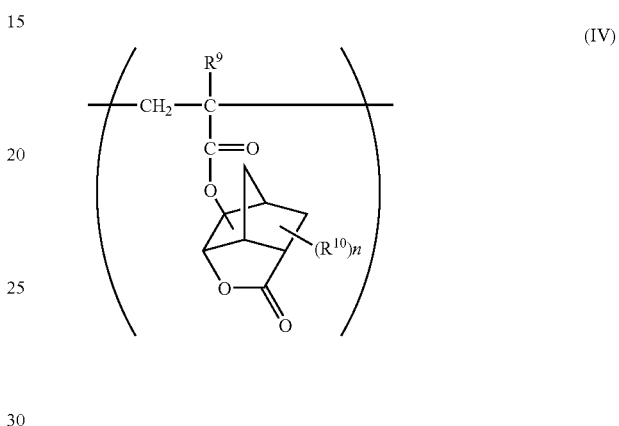

In the formula (V), $R^9$ represents hydrogen or methyl, $R^{10}$ represents methyl and n represents an integer of 0 to 3, with the proviso that when n is more than 1, each of the $R^{10}$ may be identical or different.

3 Hydroxy-1-adamantyl (meth)acrylate and 3,5-dihydroxy-1-adamantyl (meth)acrylate can be produced, for example, by reacting corresponding hydroxyadamantane with (meth)acrylic acid or its acid halide, and they are also commercially available.

Further (meth)acryloyloxy-γ-butyrolactone can be produced by reacting α- or β-bromo-γ-butyrolactone having a lactone ring optionally substituted by alkyl with acrylic acid or methacrylic acid, or reacting α- or β-bromo-γ-butyrolactone having a lactone ring optionally substituted by alkyl with acrylic halide or methacrylic halide.

Examples of monomers for the structural units of the formulae (IV) include the compounds of the followings:

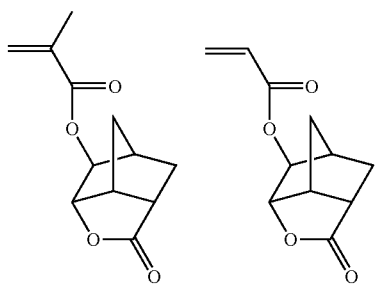

-continued

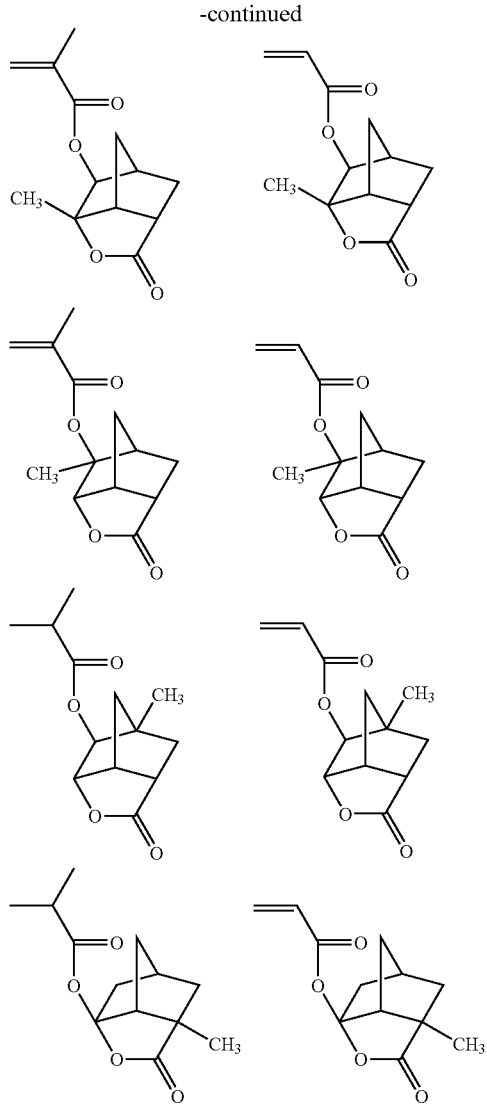

These esters can be produced, for example, by reacting corresponding alicyclic lactone having hydroxyl with (meth)acrylic acids, and the production method thereof is described in, for example, JP2000-26446-A.

When any of the structural unit derived from 3-hydroxy-1-adamantyl (meth)acrylate optionally substituted by alkyl or alkoxy, the structural unit derived from 3,5-dihydroxy-1-adamantyl (meth)acrylate optionally substituted by alkyl or alkoxy, the structural unit derived from (meth)acryloyloxy-γ-butyrolactone optionally substituted by alkyl and the structural unit of the formulae (IV) is contained in the resin, not only the adhesiveness of the resist to a substrate is improved, but also the resolution of the resist is improved.

Examples of monomers for the structural units derived from 3-hydroxy-1-adamantyl (meth)acrylate optionally substituted by alkyl or alkoxy or for the structural unit derived from 3,5-dihydroxy-1-adamantyl (meth)acrylate optionally substituted by alkyl or alkoxy include 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 3-hydroxy-5,7-dimethyl-1-adamantyl acrylate, 3-hydroxy-5,7-dimethyl-1-adamantyl methacrylate, 3-hydroxy-5,7-dimethoxy-1-adamantyl acrylate, 3-hydroxy-5,7-dimethoxy-1-adamantyl methacrylate, and the like.

Examples of the monomers for the structural units derived from (meth)acryloyloxy-γ-butyrolactone optionally substituted by alkyl include (α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl γ-butyrolactone, α-methacryloyloxy-α-methyl-γ-butyrolactone, β-acryloyloxy-γ-butyrolactone, β-methacryloyloxy-γ-butyrolactone, β-methacryloyloxy-α-methyl-γ-butyrolactone, and the like.

In these cases, it is advantageous from the standpoint of dry etching resistance to contain 2-alkyl-2-adamantyl or 1-(1-adamantyl)-1-alkylalkyl as the acid labile group in the resin.

The resin used in the present composition preferably contains structural unit(s) having an acid labile group generally in a ratio of 10 to 80% by mol, preferably 10 to 50% by mol, in all structural units of the resin though the ratio varies depending on the kind of radiation for patterning exposure, the kind of an acid-labile group, and the like.

When the structural unit(s) particularly derived from optionally substituted 2-alkyl-2-adamantyl (meth)acrylate or from optionally substituted 1-(1-adamantyl)-1-alkylalkyl (meth)acrylate is contained as the structural unit having the acid-labile group(s), it is advantageous that the ratio of total of said structural units is 10% by mol or more in all structural units of the resin.

When the structural unit(s) particularly derived from optionally substituted 1-alkylcyclohexyl (meth)acrylate or from optionally substituted 1-alkylcyclopentyl (meth)acrylate is contained as the structural unit having the acid-labile group(s), it is advantageous that the ratio of total of said structural units is 10% by mol or more in all structural units of the resin.

When, in addition to structural units having an acid-labile group, other structural units not easily dissociated by the action of an acid, for example, a structural unit derived from 3-hydroxy-1-adamantyl (meth)acrylate optionally substituted by alkyl or alkoxy, a structural units derived from 3,5-dihydroxy-1-adamantyl (meth)acrylate optionally substituted by alkyl or alkoxy or (meth)acryloyloxy-γ-butyrolactone optionally substituted by alkyl, a structural unit of the formula (IV) and the like are contained, it is preferable that the sum of these structural units is in the range of 20 to 90% by mol based on all structural units of the resin.

The acid generator, another component of the positive resist composition, is the compound which is decomposed to generate an acid by allowing radioactive ray such as light and electron beam to act on the acid generator itself or a resist composition containing the acid generator. The acid generated from the acid generator acts on the resin component, to dissociate acid-labile group present in the resin component.

Such acid generators include, for example, onium salt, halogen containing compounds, diazoketone, sulfone compounds, sulfonate compounds, and the like. Sulfonate compounds are preferred.

Examples of the acid generator in the present resist composition include a sulfonium salt of the formula (VIIa)

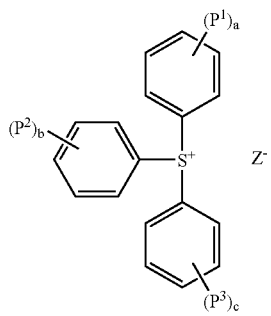

(VIIa)

wherein $P^1$ to $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^2$ is the same or different, when b is 2 or more, each of $P^2$ is the same or different, when c is 2 or more, each of $P^3$ is the same or different, and $Z^-$ represents a counter anion;

an iodonium salt of the formula (VIIb)

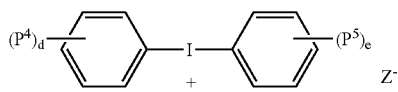

(VIIb)

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above; or a sulfonium salt of the formula (VIIc)

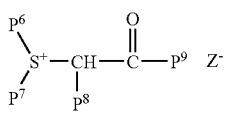

(VIIc)

wherein $P^6$ and $P^7$ each independently represents an alkyl having 1 to 6 carbon atoms or a cycloalkyl having 3 to 10 carbon atoms, of $P^6$ and $P^7$ bond to form a divalent acyclic hydrocarbon having 3 to 7 carbon atoms which forms a ring together with the adjacent $S^+$, and at least one —$CH_2$— in the divalent acyclic hydrocarbon may be substituted by —CO—, —O— or —S—, $P^8$ represents a hydrogen, $P^9$ represents an alkyl having 1 to 6 carbon atoms, a cycloalkyl having 3 to 10 carbon atoms or a aromatic ring group optionally substituted, or $P^8$ and $P^9$ bond to form 2-oxocyloalkyl together with the adjacent —CHCO—, and $Z^-$ has the same meaning as defined above.

In $P^1$, $P^2$, $P^3$, $P^4$ and $P^5$, specific examples of the alkyl include methyl, ethyl, propyl, isopropyl, butyl, tert-butyl, pentyl, hexyl and the like, and examples of the alkoxy include methoxy, ethoxy, propoxy, isopropoxy, butoxy, tert-butoxy and the like.

In $P^6$, $P^7$ and $P^9$ specific examples of the alkyl include methyl, ethyl, propyl, isopropyl, butyl, tert-butyl, pentyl, hexyl and the like, and specific examples of the cycloalkyl include cyclopropyl, cyclobutyl, cyclopentyl, cyclohexyl, cycloheptyl and the like. Specific examples of the ring group formed by adjacent $S^+$ and divalent acyclic hydrocarbon by $P^6$ and $P^7$ include tetrahydrothiophenium group, tetrahydro-2H-thiopyranium group, 1,4-oxathianium group, and the like. In $P^9$, specific examples of the aromatic ring group include phenyl, tolyl, xylyl, naphtyl and the like. Specific examples of the 2-oxocycloalkyl formed by bonding $P^8$ and $P^9$ together with the adjacent —CHCO— include 2-oxocyclohexyl, 2-oxocyclopentyl and the like.

Specific examples of cations in the formulas (VIIa), (VIIb) or (VIIc) include the followings:

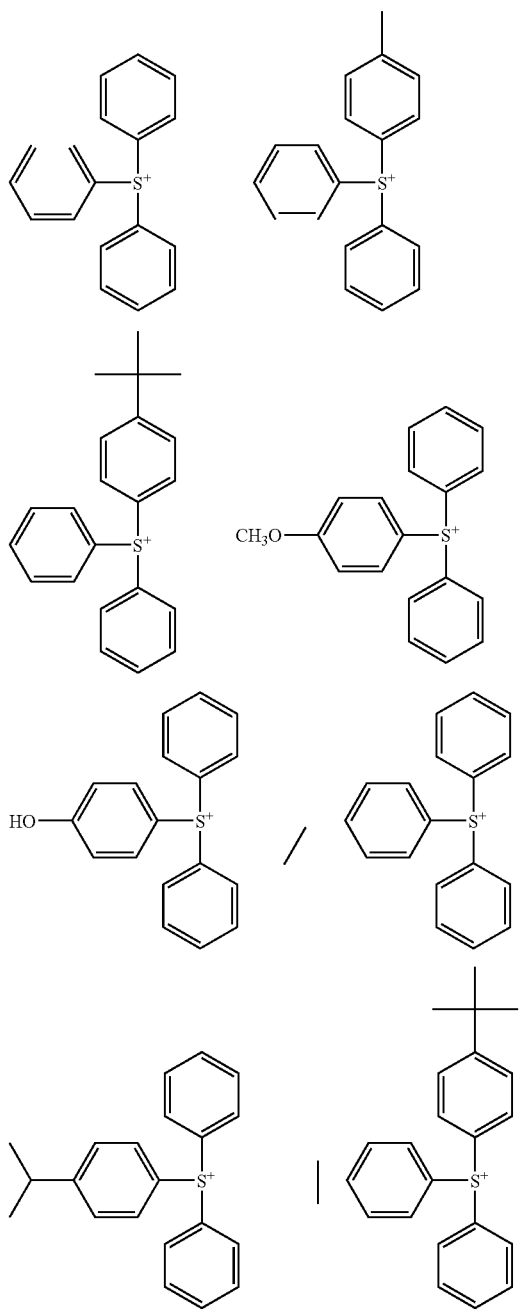

-continued
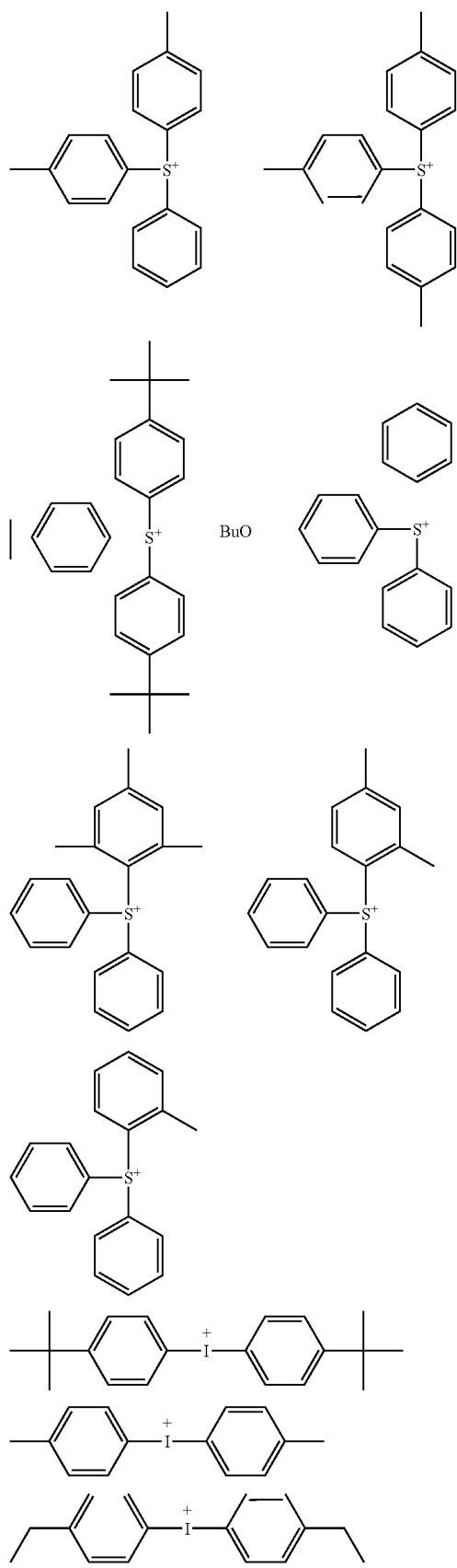
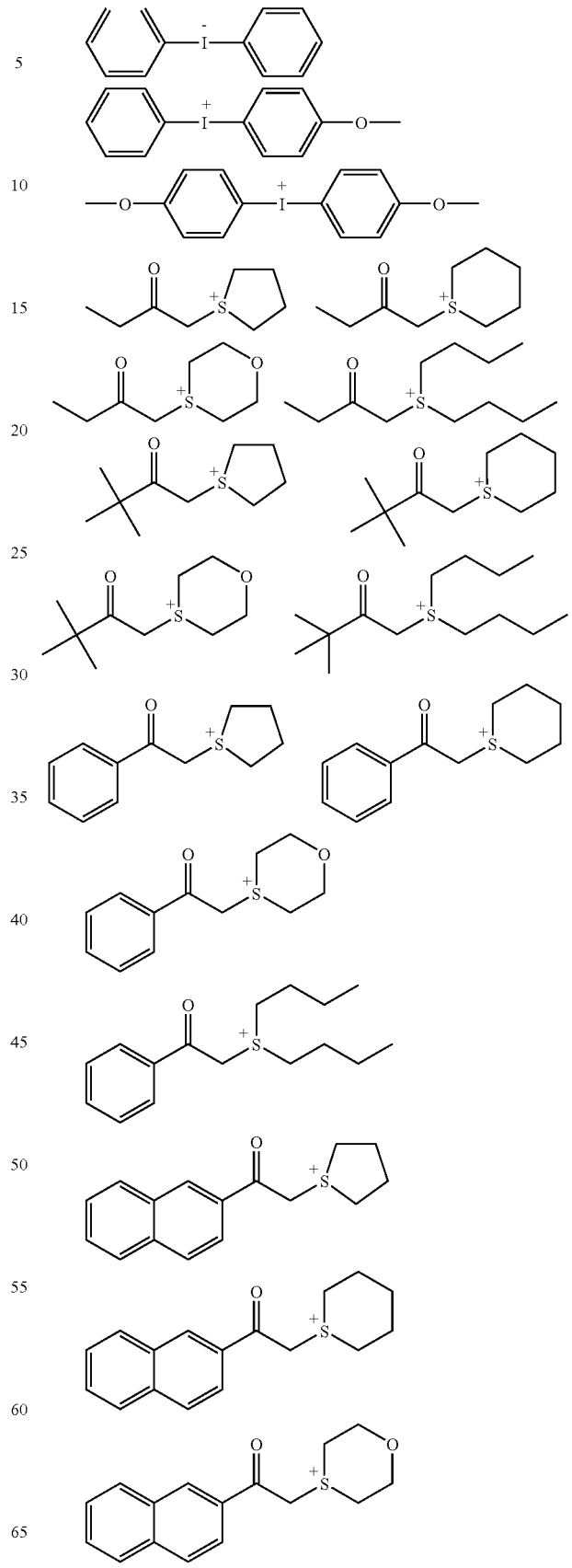

-continued

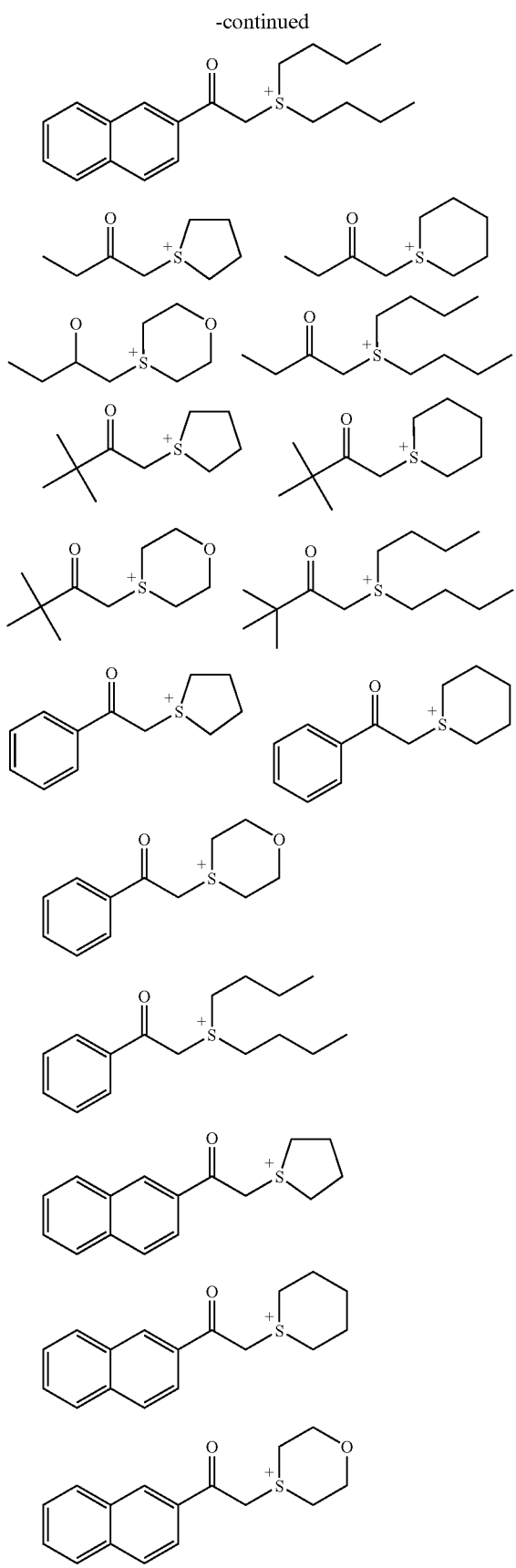

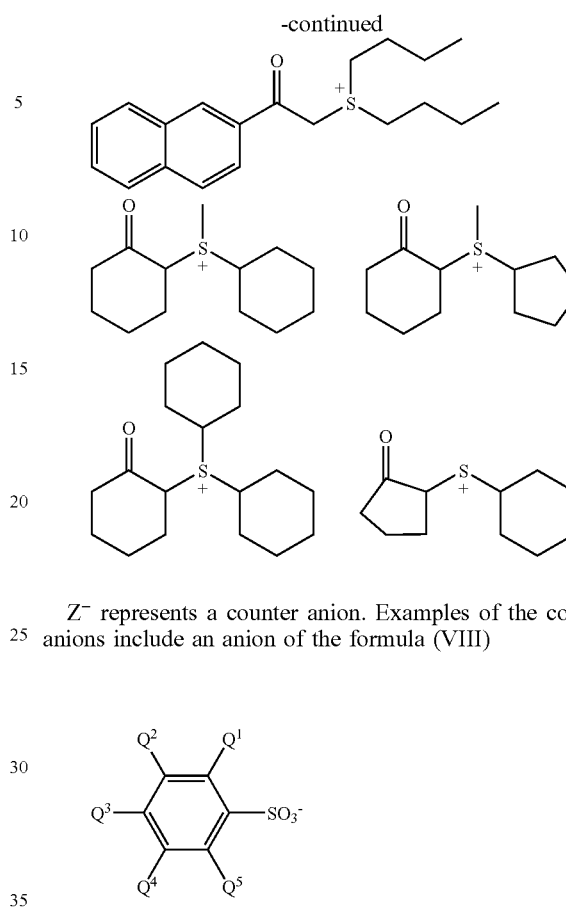

$Z^-$ represents a counter anion. Examples of the counter anions include an anion of the formula (VIII)

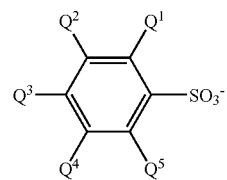

(VIII)

wherein $Q^1$, $Q^2$, $Q^3$, $Q^4$ and $Q^5$ each independently represents a hydrogen, an alkyl leaving 1 to 16 carbon atoms, an alkoxy having 1 to 16 carbon atoms, a halogen, a formyl, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

—COO—X—$Cy^1$ (VIII')

wherein X represents an alkylene and at least one —$CH_2$— in the alkylene may be substituted by —O— or —S—, $Cy^1$ represents an alicyclic hydrocarbon having 3 to 20 carbon atoms.

Examples of the alkyl having 1 to 16 carbon atoms include methyl, ethyl, propyl, isopropyl, butyl, tert-butyl, pentyl, hexyl, octyl, decyl, dodecyl, hexadecyl, and the like.

Examples of the alkoxy having 1 to 16 carbon atoms include, ethoxy, propoxy, isopropoxy, butoxy, tert-butoxy, pentyloxy, hexyloxy, isopentyloxy, decyloxy, dodecyloxy, hexadecyloxy, and the like.

Examples of halogen include fluorine, chlorine, bromine, iodine, and the like.

Examples of the haloalkyl having 1 to 8 carbon atoms include trifluoromethyl, perfluoroethyl, perfluoropropyl, perfluoroisopropyl, perfluorobutyl, perfluoroisobutyl, perfluoro-sec-butyl, perfluoro-tert-butyl, perfluorooctyl, and the like.

Examples of aryl having 6 to 12 carbon atoms include phenyl, tolyl, methoxyphenyl, naphtyl, and the like.

Examples of the aralkyl having 7 to 12 carbon atom include benzyl, chlorobenzyl, methoxybenzyl, and the like.

Examples of the alkylthio having 1 to 4 carbon atoms include methylthio, ethylthio, propylthio, isopropylthio, butylthio, tert-butylthio, and the like.

Examples of the alkylsulfonyl having 1 to 4 carbon atoms include methylsulfonyl, ethylsulfonyl, propylsulfonyl, isopropylsulfonyl, butylsulfonyl, tert-butylsulfonyl, and the like.

When two or more of $Q^1$, $Q^2$, $Q^3$, $Q^4$ and $Q^5$ are the groups of the formula (VIII'), the groups of the formula (VIII') may be identical or different.

Examples of X include the followings:

—CH$_2$— (a-1)

—CH$_2$—CH$_2$— (a-2)

—CH$_2$—CH$_2$—CH$_2$— (a-3)

—CH$_2$—CH$_2$—CH$_2$—CH$_2$— (a-4)

—CH$_2$—CH$_2$CH$_2$—CH$_2$—CH$_2$— (a-5)

—CH$_2$—CH$_2$—CH$_2$—CH$_2$—CH$_2$—CH$_2$— (a-6)

—CH$_2$—CH$_2$—CH$_2$—CH$_2$—CH$_2$—CH$_2$—CH$_2$—CH$_2$— (a-7)

—CH$_2$—O— (a-8)

—CH$_2$—O—CH$_2$— (a-9)

—CH$_2$—O—CH$_2$—CH$_2$— (a-10)

—CH$_2$—CH$_2$—O—CH$_2$—CH$_2$— (a-11)

—CH$_2$—S— (a-12)

—CH$_2$—S—CH$_2$— (a-13)

—CH$_2$—S—CH$_2$—CH$_2$— (a-14)

—CH$_2$—CH$_2$—S—CH$_2$—CH$_2$— (a-15)

As X, (a-1) to (a-7) above are preferred.

Examples of Cy$^1$ include the followings:

 (b-1)

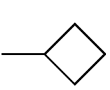 (b-2)

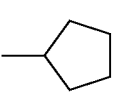 (b-3)

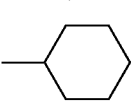 (b-4)

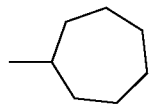 (b-5)

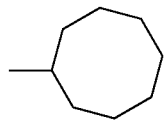 (b-6)

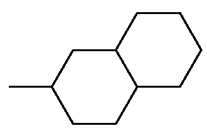 (b-11)

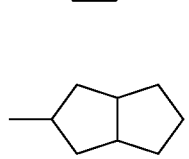 (b-12)

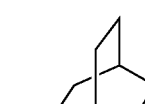 (b-13)

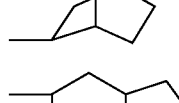 (b-14)

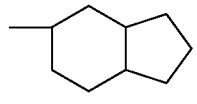 (b-15)

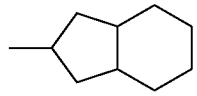 (b-16)

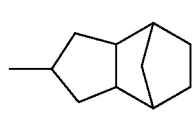 (b-21)

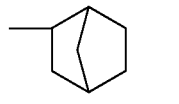 (b-22)

 (b-23)

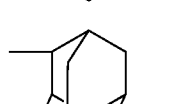 (b-24)

-continued
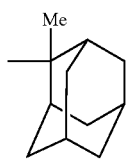 (b-25)
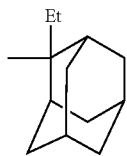 (b-26)
A Cy¹, cyclohexyl (b-4), 2-norbornyl (b-21), 2-adamantyl (b-23) and 1-adamantyl (b-24) are preferred.
Specific examples of the organic counter anion of represented by Z⁻ include the followings:
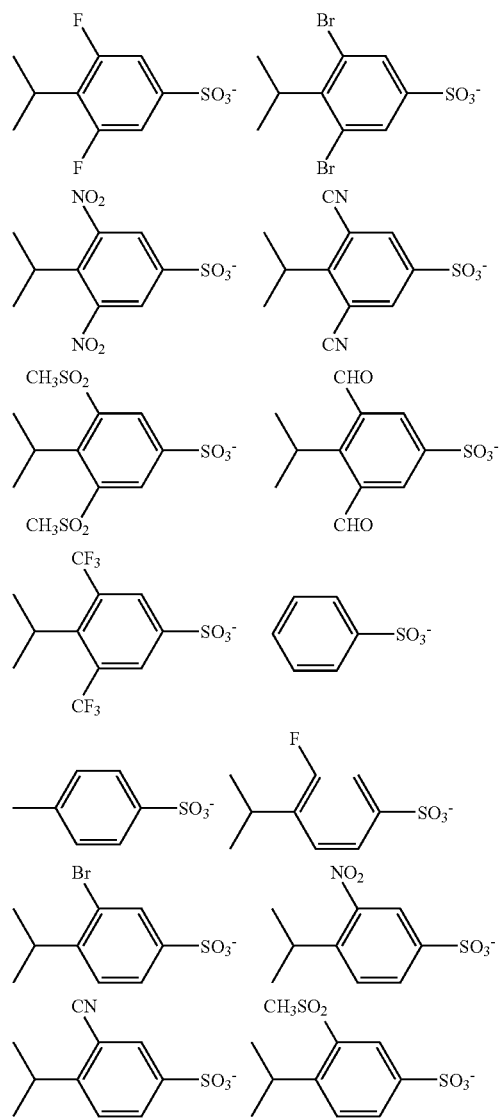
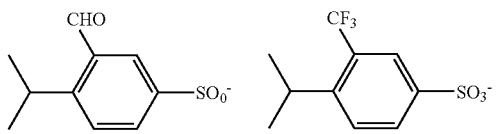
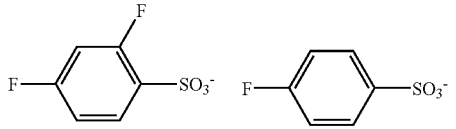
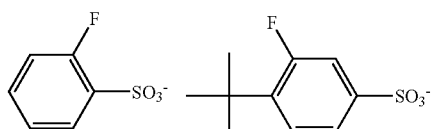
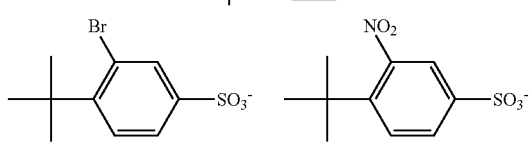
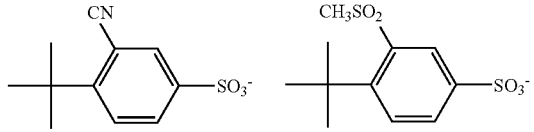
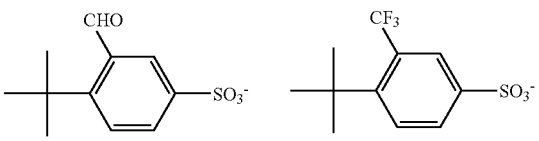
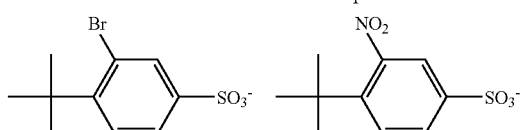
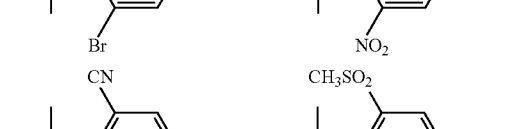
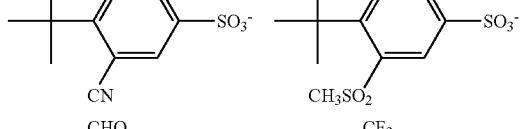
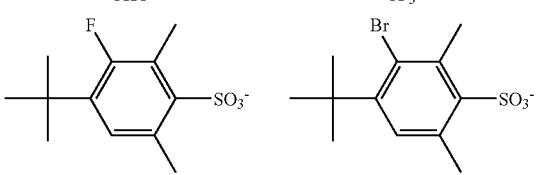
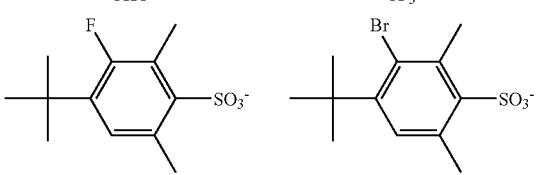

-continued
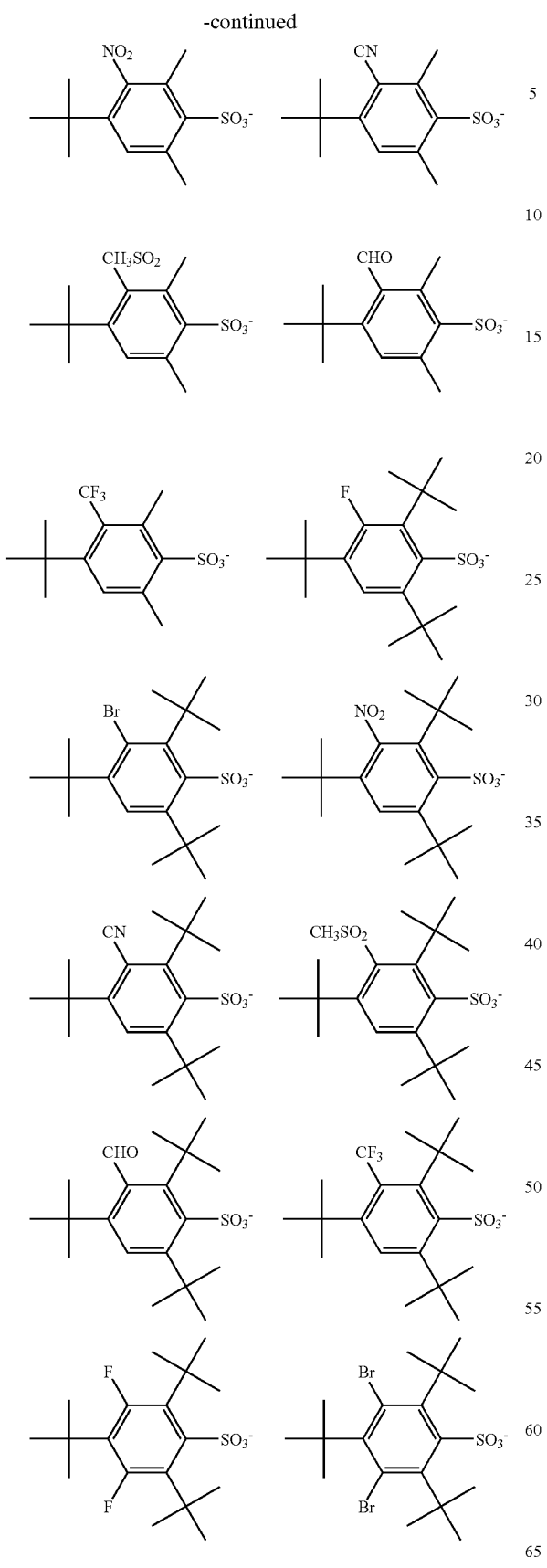
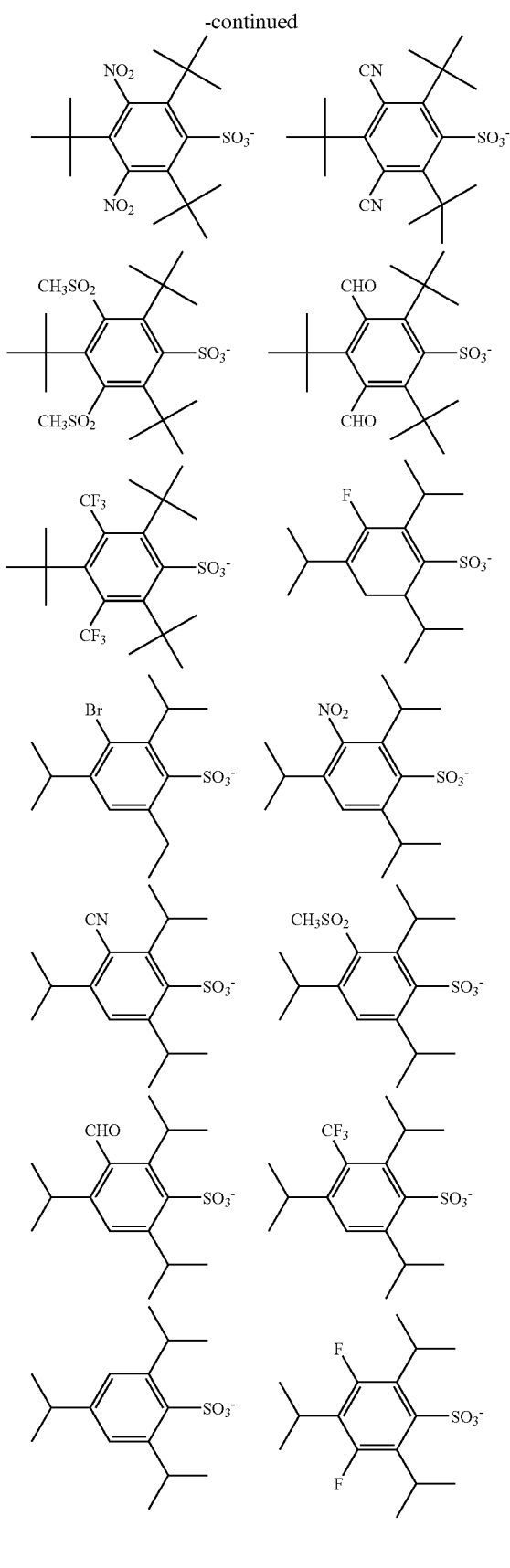

-continued
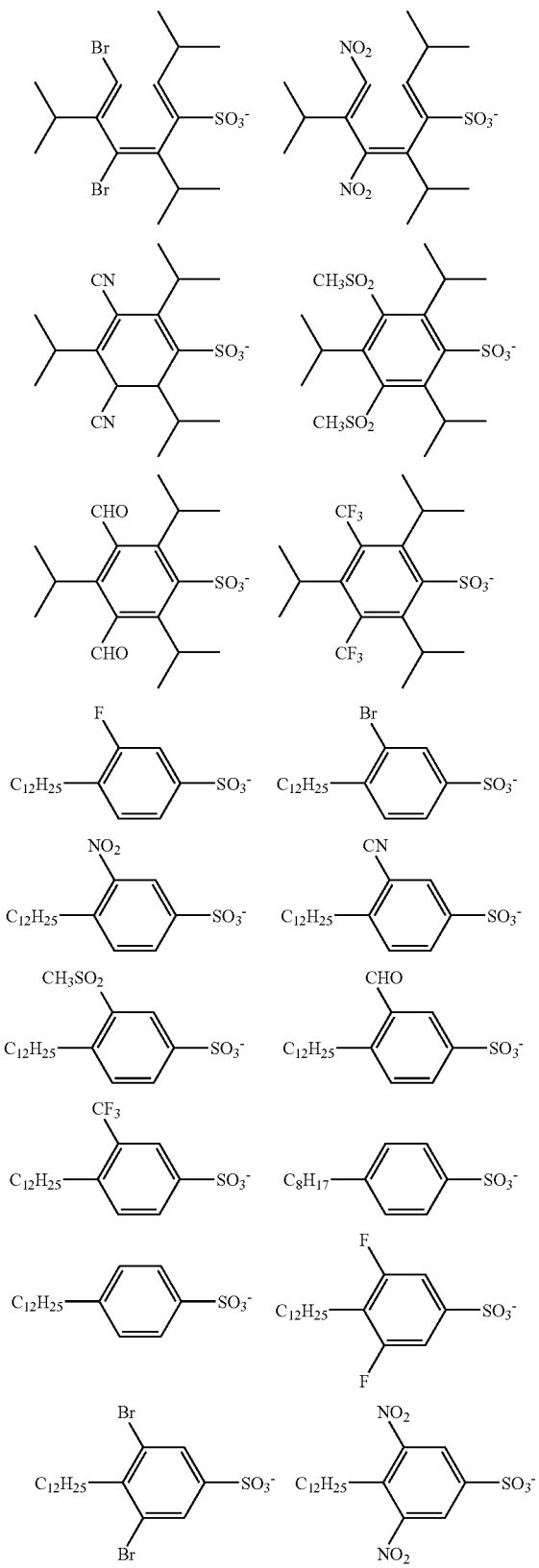
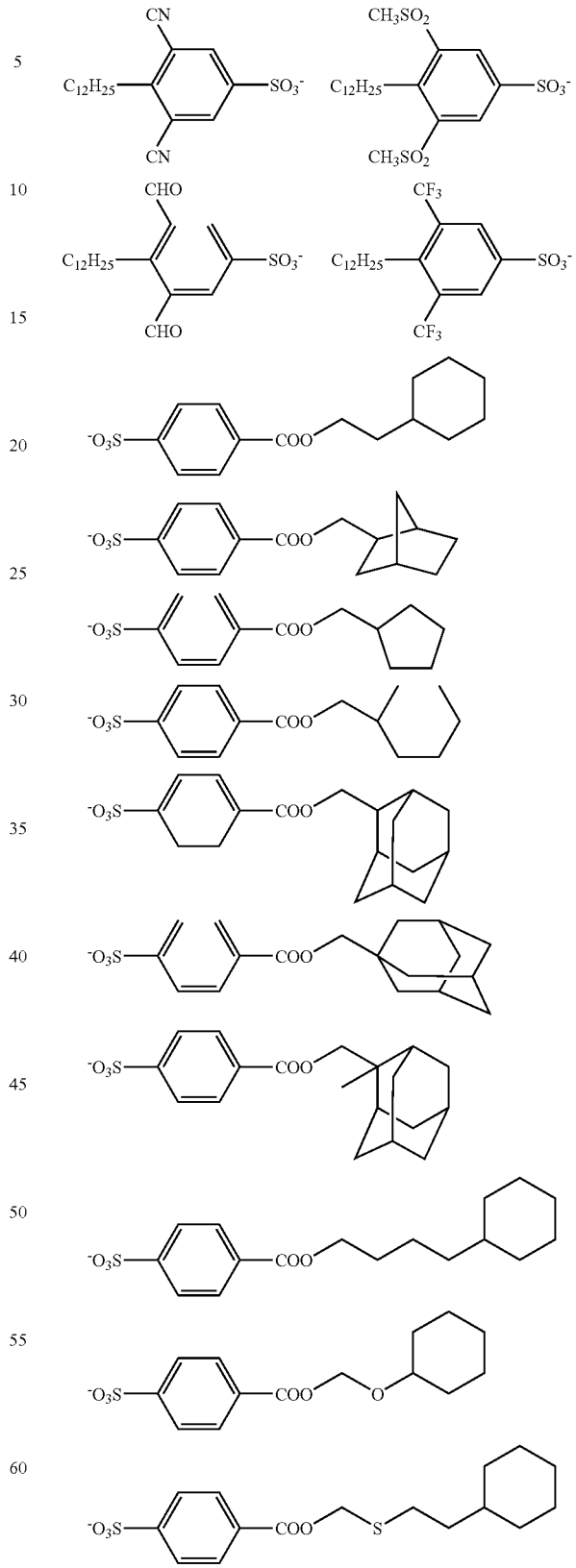

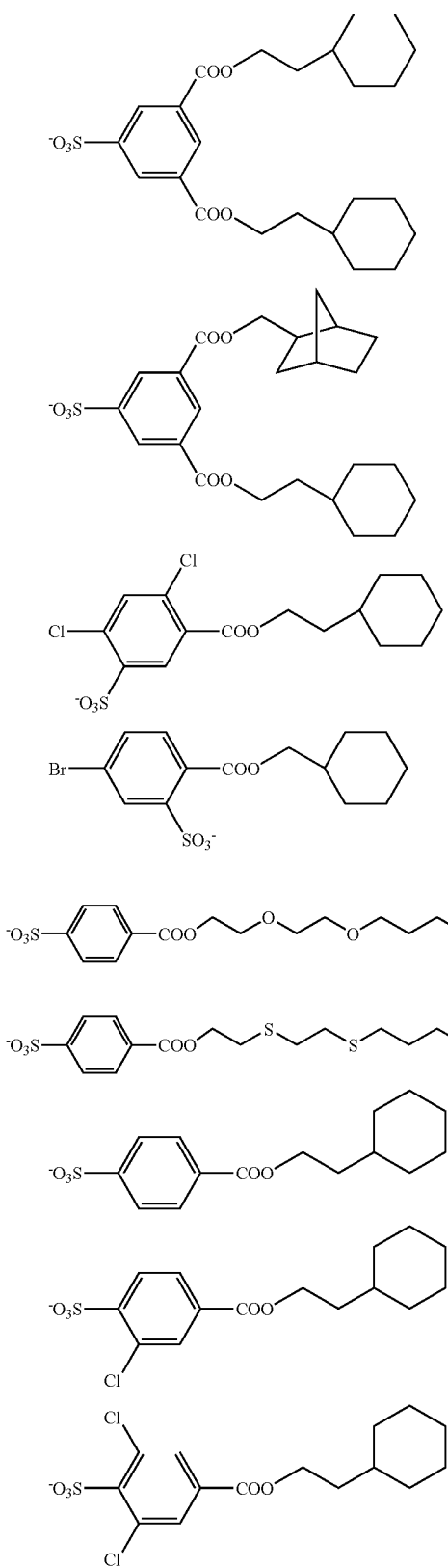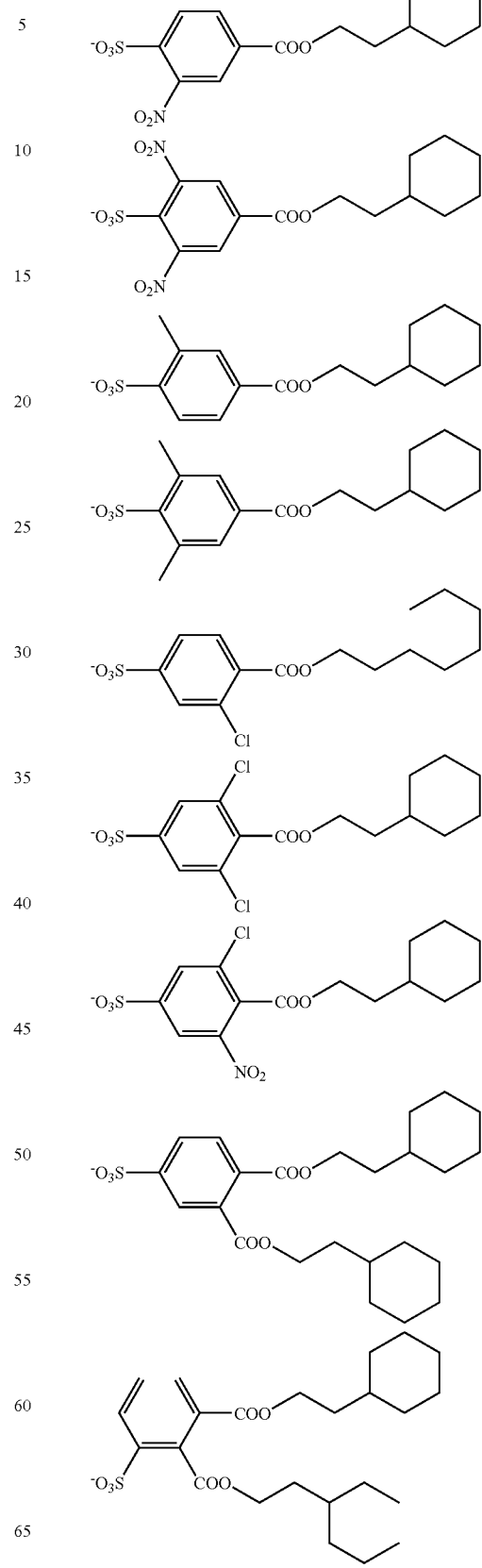

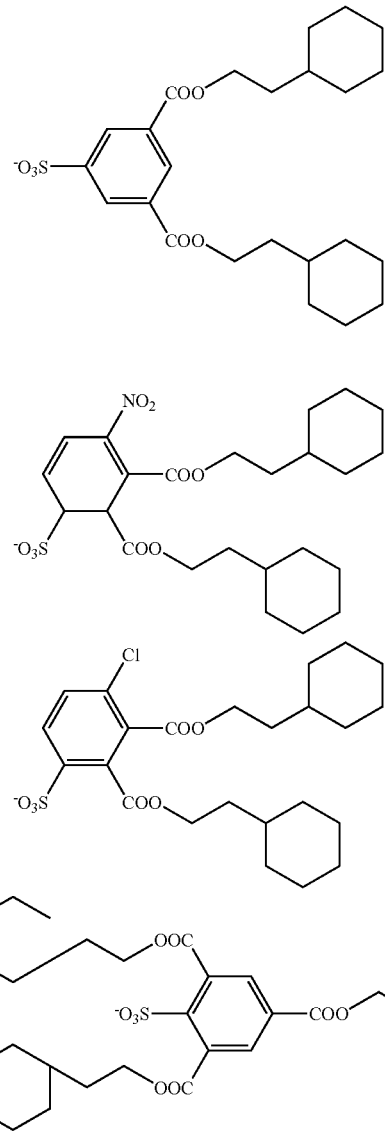

Examples of the other counter anions than the anion of the formula (VIII) include an anion of the formula (IXa)

$$^\ominus SO_3-Q^6 \qquad (IXa)$$

wherein $Q^6$ represents a perfluoroalkyl having 1 to 20 carbon atoms, an optionally substituted naphtyl having 10 to 20 carbon atoms or an optionally substituted anthryl having 10 to 20 carbon atoms and an anion of the formula (IXb)

$$Q^7\text{-}SO_2-^\ominus N-SO_2\text{-}Q^8 \qquad (IXb)$$

wherein $Q^7$ and $Q^8$ each represents a perfluoroalkyl having 1 to 20 carbon atoms or an optionally substituted aromatic group having 6 to 20 carbon atoms.

Specific examples of anion of the formula (IXa) include the followings:

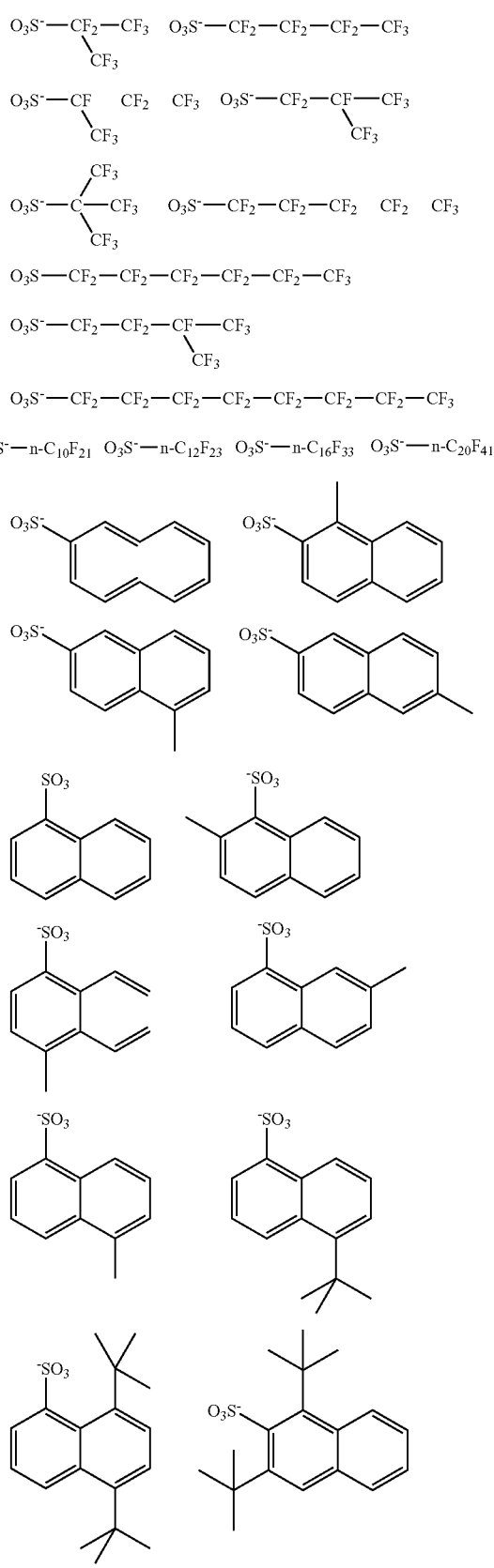

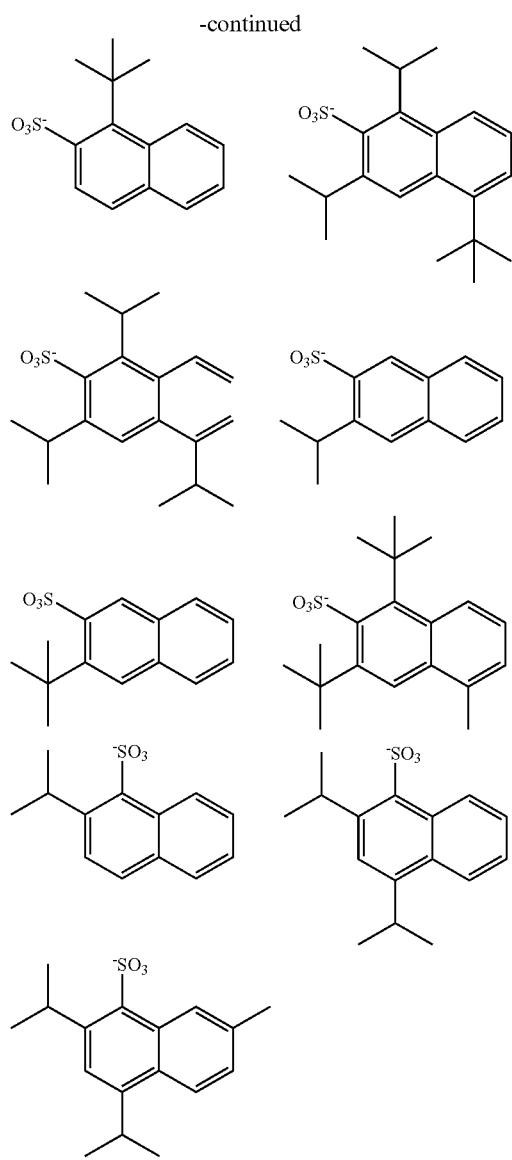
Specific examples of anion of the formula (IXb) include the followings:
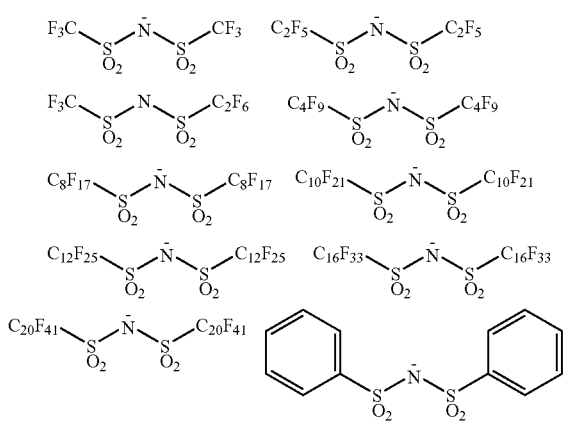
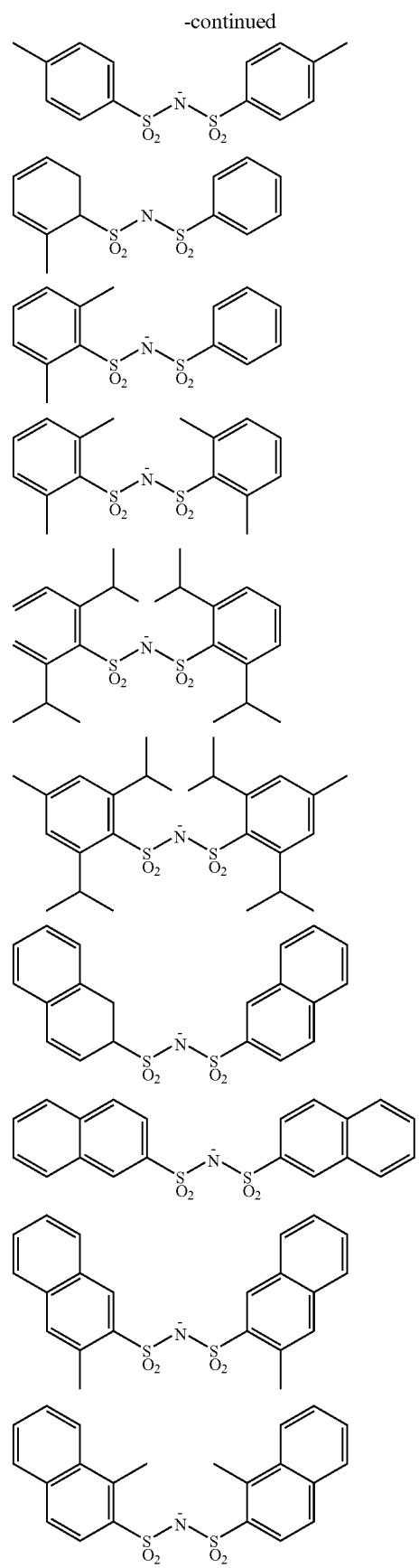

-continued

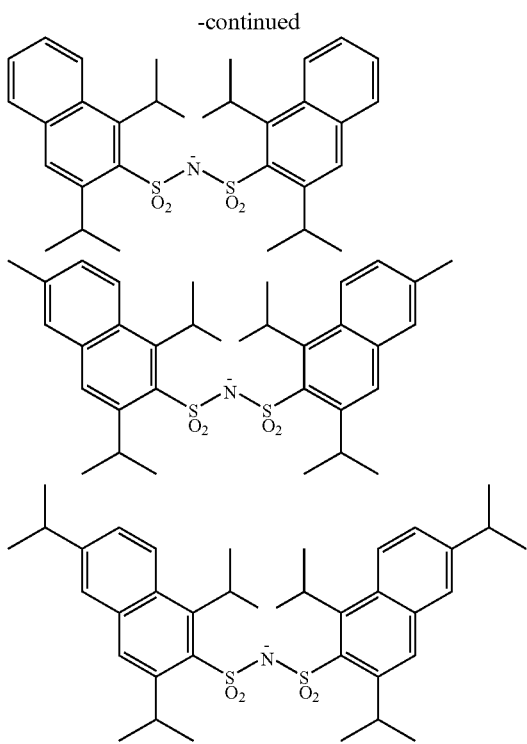

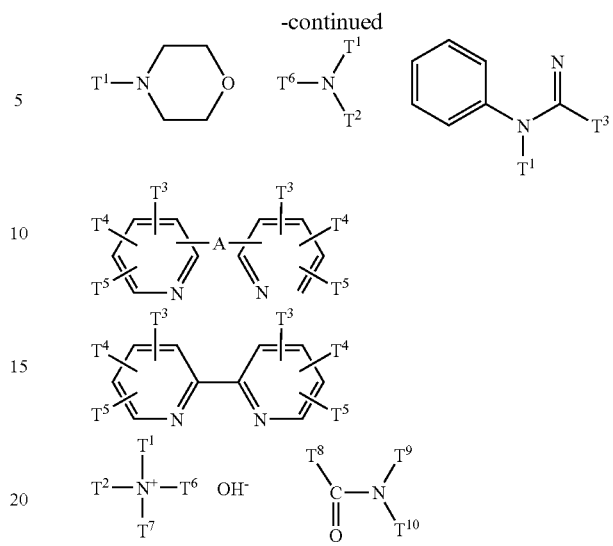

Specific examples of counter anions other than the anions of the formulas (VIII), (IXa) and (IXb) include trifluoromethanesulfonate, perfluorobutanesulfonate, perfluorooctanesulfonate, hexafluoroantimonate, tetrafluoroborate, hexafluorophosphate, and the like.

The acid generator in the present resist composition can be used commercially available products, or can be produced by conventionally known method. For example, when $Z^-$ is an anion of the formula (VIII), the sulfonium salt of the formula (VIIa), the iodonium salt of the formula (VIIb) and the sulfonium salt of the formula (VIIc) can be produced according to conventional methods.

In the present composition, performance deterioration caused by inactivation of acid which occurs due to post exposure delay can be diminished by adding organic basic compounds, particularly, basic nitrogen-containing organic compounds, for example, amines as a quencher.

Specific examples of such basic nitrogen-containing organic compounds include the ones represented by the following formulas:

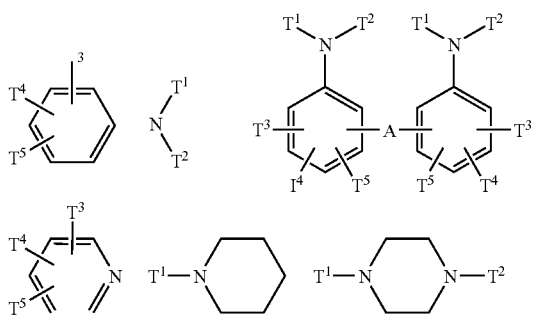

In the formulas, $T^1$ and $T^2$ each independently represents a hydrogen, an alkyl, a cycloalkyl or an aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with a hydroxyl, an amino, or an alkoxy having 1 to 6 carbon atoms. At least one hydrogen on the amino may each independently be substituted with an alkyl having 1 to 4 carbon atoms.

$T^3$, $T^4$ and $T^5$ each independently represents a hydrogen, an alkyl, a cycloalkyl, an aryl or an alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy may each independently be substituted with a hydroxyl, an amino, or an alkoxy having 1 to 6 carbon atoms. At least one hydrogen on the amino may be substituted with an alkyl group having 1 to 4 carbon atoms.

$T^6$ represents an alkyl or a cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with a hydroxyl, an amino, or an alkoxy having 1 to 6 carbon atoms. At least one hydrogen on the amino may each independently be substituted with an alkyl group having 1 to 4 carbon atoms.

In the formulas, $T^7$ represents as alkyl, a cycloalkyl or an aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with a hydroxyl, an amino, or an alkoxy having 1 to 6 carbon atoms. At least one hydrogen on the amino each independently may be substituted with an alkyl having 1 to 4 carbon atoms.

However, none of $T^1$ and $T^2$ in the compound represented by the above formula (XII) is a hydrogen.

A represents an alkylene, a carbonyl, an amino, a sulfide or a disulfide. The alkylene preferably has about 2 to 6 carbon atoms.

Moreover, among $T^1$—$T^1$, in regard to those which can be straight-chained or branched, either of these may be permitted.

$T^8$, $T^9$ and $T^{10}$ each independently represents a hydrogen, an alkyl having 1 to 6 carbon atoms, an aminoalkyl having 1 to 6 carbon atoms, a hydroxyalkyl having 1 to 6 carbon atoms or a substituted or unsubstituted aryl having 6 to 20 carbon atoms, or $T^8$ and $T^9$ bond to form an alkylene which forms a lactam ring together with adjacent —CO—N—.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripiopylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydipentylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methyimidazole, bipyridine, 2,2'-dipyridylamine, di-2-pyridyl ketone, 1,2-di(2-pyridyl)ethane, 1,2 di(4 pyridyl)ethane, 1,3-di(4 pyridyl)propane, 1,2 bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Furthermore, hindered amine compounds having piperidine skeleton as disclosed in JP-A-II11-52575 can be used as quencher.

As the present compound gives patterns with improved resolution, it is preferred that the compound of the formula (XII) is used as a quencher. Specifically, examples of such preferred compounds include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide, and the like.

It is preferable that the present composition contains the resin component in an amount of about 80 to 98.5% by weight, the acid generator in an amount of 1 to 5% by weight and the compound of the formula (C 1) in an amount of 0.5 to 10% by weight based on the total amount of solid content.

When organic basic compound is used as a quencher, the basic compound is contained preferably in an amount of about 0.001 to 1 part by weight, more preferably in an amount of about 0.01 to 1 part by weight based on 100 parts by weight of the resin component.

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in wind the aforementioned ingredients are dissolved in a solvent, and the resist liquid composition is to be applied unto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvent(s).

Examples thereof include glycol ether esters such as ethylcellosolve acetate, methylcellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be further illustrated by examples. However, the present invention is not limited to them at all.

The "%" and "part(s)" used to represent the content of any component and the mount of any material used in the following examples are on a weight basis unless otherwise specifically noted. The weight-average molecular weight of any material used in the following examples is a value found by gel permeation chromatography using styrene as a standard reference material.

The following monomers (monomers A, B and C) are used in the Resin Synthesis Examples.

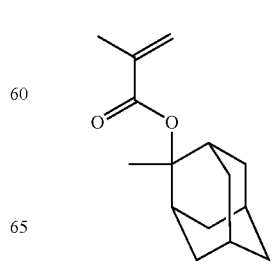

A

-continued

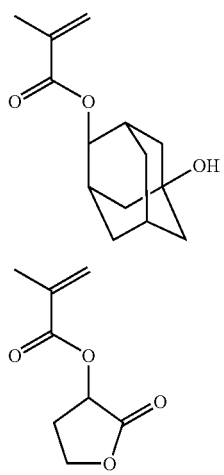

Resin Synthesis Example 1 (Synthesis of Resin A1)

The monomers A, B and C were charged at a molar ratio of 5:2.5:5 (20.0 parts:10.1 parts:7.3 parts), and dioxane in twice weight based on all monomers was added, and then to the solution was added azobisisobutyronitrile as an initiator in a ratio of 2.5 mol % based on all monomer molar amount. The mixture was heated at 80° C. for about 8 hours. Then, the reaction solution was poured into large amount of heptane to cause precipitation, and this operation was repeated three times for purification. As a result, copolymer having a weight-average molecular weight of about 9,000 was obtained. This is called resin R1.

Examples 1 to 3 and Comparative Examples 1 to 3

The following components were mixed and dissolved, further, filtrated through a fluorine resin filter having pore diameter of 0.2 μm, to prepare resist liquid.

<Resin>
R1 (The amount is described in Table 1.)

<Acid Generator>
S1: 4-methylphenyldiphenylsulfonium perfluorobutane-sulfonate (The amount is described in Table 1.)

<Quencher>
Q1: 2,6-diisopropylaniline
Q2: tetramethylammonium hydroxide
(The kind and amount are described in Table 1.)

<Solvent>
Y1: A mixture of the following solvents

| propylene glycol monomethyl ether acetate | 85.5 parts |
| γ-butyrolactone | 4.5 parts |

<The compound of the formula (C-2) or (CX-1)>

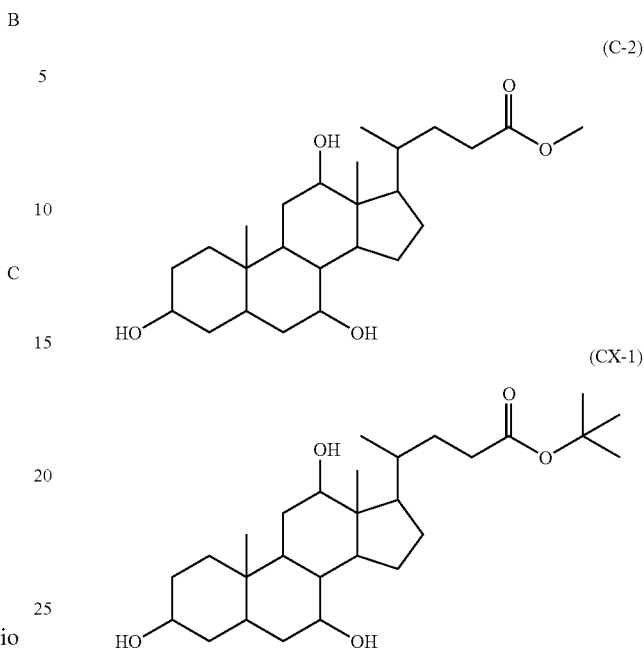

(The amount of each compound is described in Table 1.)

Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.25 μm after drying. The silicon wafers thus coated with the respective resist liquids were each prebaked on a direct hotplate at temperature shown in "PB" column in Table 1 for 60 seconds. Using an ArF excimer stepper ("NSR ArF" manufactured by Nikon Corporation, NA=0.55, ⅔ Annular), each wafer thus formed with the respective resist film was subjected to exposure through mask of contact hole pattern, with the exposure quantity being varied stepwise.

After the exposure, each wafer was subjected to post-exposure baking on a hotplate at temperature shown in "PEB" column in Table 1 for 60 seconds and then to puddle development for 60 seconds with an aqueous solution of 2.38 wt % tetramethylammonium hydroxide.

The patterns developed on the organic anti-reflective coating substrate were observed with a scanning electron microscope, the results of which are shown in Table 2.

Evaluation of Resolution of Contact Hole Pattern: It is expressed as the size of diameter (μm) of contact hole resolved at the minimum exposure amount capable of reproducing contact hole having 0.18 mm of diameter.

Effective Sensitivity is defined as the exposure amount above.

Evaluation of Accuracy of Roundness: If contact hole shows good accuracy of roundness when the contact hole is observed from right above, it is evaluated as ○. If it is milled, it is evaluated as ×.

Evaluation of Shape of Cross Section of Pattern: The pattern having good shape is evaluated as ⊙. The pattern having T-Top shape but resolve is evaluated as ○.
If the pattern can not be formed, it is evaluated as ×.

TABLE 1

| Example No. | Amount of Resin R1 (Parts) | Amount of Acid Generator S1 (Part) | Kind and Amount of Quencher (Part) | Kind and Amount of C-2 or CX-1 (Part) | PB | PEB |
|---|---|---|---|---|---|---|
| Example 1 | 10 | 0.3 | Q1/0.017 | C-2/0.25 | 130° C. | 125° C. |
| Example 2 | 10 | 0.3 | Q1/0.017 | C-2/0.50 | 130° C. | 125° C. |
| Example 3 | 10 | 0.3 | Q2/0.025 | C-2/0.25 | 130° C. | 125° C. |
| Comparative Example 1 | 10 | 0.3 | Q1/0.017 | 0 | 130° C. | 125° C. |
| Comparative Example 2 | 10 | 0.3 | Q2/0.025 | 0 | 130° C. | 125° C. |
| Comparative Example 3 | 10 | 0.3 | Q1/0.017 | CX-1/0.25 | 130° C. | 125° C. |
| Comparative Example 4 | 10 | 0.3 | Q1/0.017 | CX-1/0.50 | 130° C. | 125° C. |

TABLE 2

| Example No. | Resolution of Contact Hole Pattern | Effective Sensitivity (mJ/cm2) | Accuracy of roundness | Shape of Cross Section |
|---|---|---|---|---|
| Example 1 | 0.15 | 32 | ○ | ○ |
| Example 2 | 0.15 | 34 | ○ | ⊙ |
| Example 3 | 0.15 | 34 | ○ | ⊙ |
| Comparative Example 1 | 0.15 | 32 | X | ○ |
| Comparative Example 2 | 0.15 | 34 | X | ○ |
| Comparative Example 3 | 0.15 | 33 | X | ○ |
| Comparative Example 4 | 0.15 | 36 | ○ | ○ |

The chemically amplified positive resist composition of the present invention is capable of resolving fine contact hole pattern with less deterioration of sensitivity as well as being excellent in various resist properties such as accuracy of roundness, pattern shape, and the like. Therefore, it is suitable for excimer laser lithography using ArF or KrF, especially ArF.

What is claimed is:

1. A chemically amplified positive resist composition comprising a resin which contains a structural unit having an acid labile group and which itself is insoluble or poorly soluble in an alkali aqueous solution and becomes soluble in an alkali aqueous solution by the action of an acid;

an acid generator; and a compound of the formula (C-1)

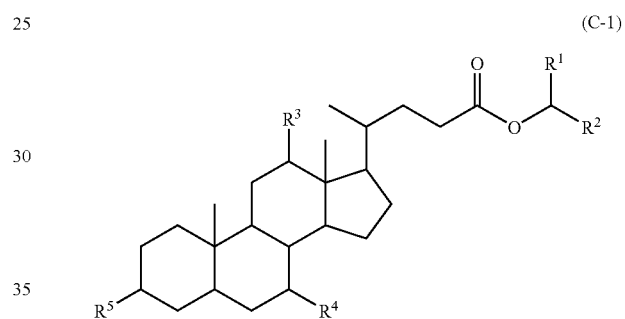

wherein $R^1$ and $R^2$ each independently represents a hydrogen or an alkyl having 1 to 4 carbon atoms, $R^3$, $R^4$ and $R^5$ each independently represents a hydrogen or a hydroxyl.

2. The composition according to claim 1, wherein the content of the resin, the content of the acid generator and the content of the compound of the formula (C-1) are 80 to 98.5% by weight, 1 to 5% by weight and 0.5 to 10% by weight respectively, based on the total solid content of the composition.

3. The composition according to claim 1, wherein the content of the structural unit having an acid labile group is 10 to 50% by mol in the total structural units of the resin.

4. The composition according to claim 1, wherein the structural unit having an acid-labile group is a structural unit derived from 2-alkyl-2-adamantyl (meth)acrylate optionally substituted or 1-(1-adamantyl)-1-alkylalkyl (meth)acrylate optionally substituted.

5. The composition according to claim 4, wherein the resin further contains at least one structural unit selected from the group consisting of a structural unit derived from optionally substituted 1-alkylcyclohexyl (meth)acrylate or a structural unit derived from optionally substituted 1-alkyl-cyclopentyl (meth)acrylate.

6. The composition according to claim 1, wherein the resin further contains, in addition to the structural unit having the acid-labile group, at least one structural unit selected from the group consisting of a structural unit derived from optionally substituted 3-hydroxy-1-adamantyl (meth)acrylate, a structural unit derived from optionally substituted 3,5-dihydroxy-1-adamantyl (meth)acrylate, a structural unit derived from (meth)acryloyloxy-γ-butyrolactone having a lactone ring optionally substituted by alkyl and a structural unit of the following formula (IV)

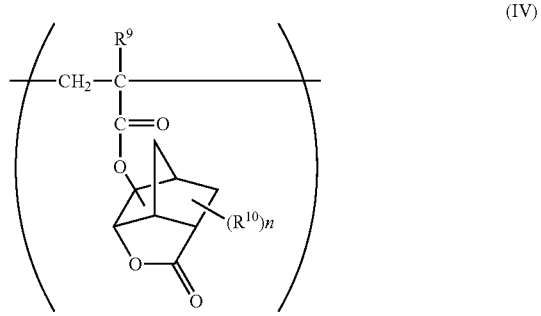

wherein $R^9$, represents a hydrogen or a methyl, $R^{10}$ represents a methyl, and n represents an integer of 0 to 3.

7. The composition according to claim 1, wherein the acid generator is a compound of the formula (VIIa):

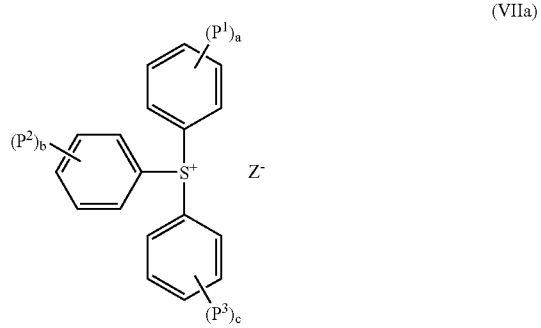

wherein $P^1$, $P^2$ and $P^3$ each independently represents a hydroxyl, an alkyl having 1 to 6 carbon atoms or an alkoxy having 1 to 6 carbon atoms, a, b and c each independently represents an integer of 0 to 3, when a is 2 or more, each of $P^1$ is the same or different, when b is 2 or more, each of $P^2$ is the same or different, when c is 2 or more, each of $P^{-3}$ is the same or different, and Z represents a counter anion, a compound of the formula (VIIb):

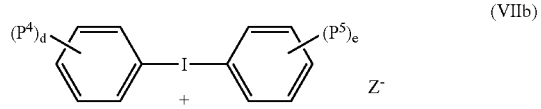

wherein $P^4$ and $P^5$ each independently represents a hydroxyl, an alkyl having 1 to 6 carbon atoms or an alkoxy having 1 to 6 carbon atoms, d and e each independently represents 0 or 1, and $Z^-$ has the same meaning as defined above, or a compound of the formula (VIIc):

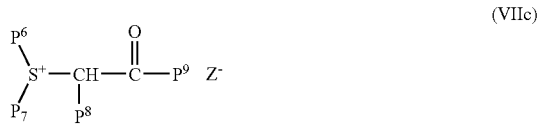

wherein $P^6$ and $P^7$ each independently represents an alkyl having 1 to 6 carbon atoms or a cycloalkyl having 3 to 10 carbon atoms, or $P^6$ and $P^7$ bond to form a divalent acyclic hydrocarbon having 3 to 7 carbon atoms which forms a ring together with the adjacent $S^+$, and at least one —$CH_2$— in the divalent acyclic hydrocarbon may be substituted by —CO—, —O— or —S—, $P^8$ represents a hydrogen, $P^9$ represents an alkyl having 1 to 6 carbon atoms, a cycloalkyl having 3 to 10 carbon atoms or an aromatic ring group optionally substituted, or $P^8$ and $P^9$ bond to form 2-oxocycloalkyl together with the adjacent —CHCO—, and $Z^-$ has the same meaning as defined above.

8. The composition according to claim 7, wherein $Z^-$ is an anion of the formula (VIII)

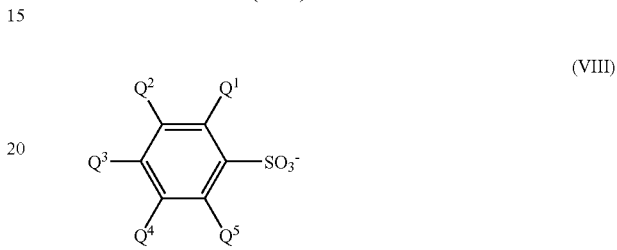

wherein $Q^1$, $Q^2$, $Q^3$, $Q^4$ and $Q^5$ each independently represents a hydrogen, an alkyl having 1 to 16 carbon atoms, an alkoxy having 1 to 16 carbon atoms, a halogen, a formyl, a haloalkyl having 1 to 8 carbon atoms, an aryl having 6 to 12 carbon atoms, an aralkyl having 7 to 12 carbon atoms, a cyano, an alkylthio having 1 to 4 carbon atoms, an alkylsulfonyl having 1 to 4 carbon atoms, a hydroxyl, a nitro or a group of the formula (VIII')

wherein X represents an alkylene and at least one —$CH_2$— in the alkylene may be substituted by —O— or —S—, $Cy^1$ represents an alicyclic hydrocarbon having 3 to 20 carbon atoms.

9. The composition according to claim 1, which further comprises organic basic compound.

10. The composition according to claim 9, wherein the organic basic compound is a compound of the formula (XII)

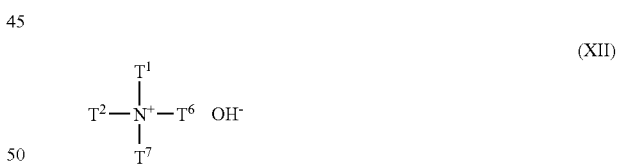

wherein $T^1$, $T^2$ and $T^7$ each independently represents an alkyl, a cycloalkyl or an aryl, wherein at least one hydrogen on the alkyl, cycloalkyl or aryl may each independently be substituted with hydroxyl, amino, or alkoxy having 1 to 6 carbon atoms, wherein at least one hydrogen on the amino each independently may be substituted with alkyl having 1 to 4 carbon atoms, and $T^6$ represents an alkyl or a cycloalkyl, wherein at least one hydrogen on the alkyl or cycloalkyl may each independently be substituted with hydroxyl, amino, or alkoxy having 1 to 6 carbon atoms, wherein at least one hydrogen on the amino may be substituted with alkyl having 1 to 4 carbon atoms.

* * * * *